(12) United States Patent
Syllaios et al.

(10) Patent No.: US 7,459,686 B2
(45) Date of Patent: Dec. 2, 2008

(54) SYSTEMS AND METHODS FOR INTEGRATING FOCAL PLANE ARRAYS

(75) Inventors: Athanasios J. Syllaios, Richardson, TX (US); Thomas R. Schimert, Ovilla, TX (US); William L. McCardel, Plano, TX (US); Roland W. Gooch, Dallas, TX (US); John F. Brady, Richardson, TX (US)

(73) Assignee: L-3 Communications Corporation, New York, NY (US)

( * ) Notice: Subject to any disclaimer, the term of this patent is extended or adjusted under 35 U.S.C. 154(b) by 20 days.

(21) Appl. No.: 11/606,880

(22) Filed: Nov. 30, 2006

(65) Prior Publication Data

US 2007/0170359 A1 Jul. 26, 2007

Related U.S. Application Data

(60) Provisional application No. 60/762,252, filed on Jan. 26, 2006.

(51) Int. Cl.
G01J 5/00 (2006.01)
(52) U.S. Cl. .................................................. 250/338.1
(58) Field of Classification Search ............... 250/338.1
See application file for complete search history.

(56) References Cited

U.S. PATENT DOCUMENTS

| | | |
|---|---|---|
| 4,143,269 A | 3/1979 | McCormack et al. |
| 4,169,273 A | 9/1979 | Hendrickson |
| 4,291,815 A | 9/1981 | Gordon et al. |
| 4,352,449 A | 10/1982 | Hall et al. |
| 4,654,622 A | 3/1987 | Foss et al. |
| 4,679,068 A | 7/1987 | Lillquist et al. |
| 4,701,424 A | 10/1987 | Mikkor |
| 4,752,694 A | 6/1988 | Hegel, Jr. et al. |
| 4,965,447 A | 10/1990 | Bly et al. |
| 5,010,251 A | 4/1991 | Grinberg et al. |
| 5,021,663 A | 6/1991 | Hornbeck |
| 5,051,591 A | 9/1991 | Trotta et al. |
| 5,082,162 A | 1/1992 | Kamiyama et al. |

(Continued)

FOREIGN PATENT DOCUMENTS

EP 0828346 A2 3/1998

(Continued)

OTHER PUBLICATIONS

Tissot et al., "Leti/Lir's Amorphous Silicon Uncooled Microbolometer Development", SPIE Conference on Infrared Detectors And Focal Plane Arrays V, vol. 3379, Apr. 1998, 6 pgs.

(Continued)

Primary Examiner—David P Porta
Assistant Examiner—Marcus H Taningco
(74) Attorney, Agent, or Firm—O'Keefe, Egan, Peterman & Enders LLP

(57) ABSTRACT

Systems and methods for providing multi-spectral image capability using an integrated multi-band focal plane array that, in one example, may be employed to simultaneously image in the visible spectrum and infrared spectrum using an integrated dual-band focal plane array, e.g., by including visible imaging circuitry within read out integrated circuitry (ROIC) used to readout infrared detector elements within the same pixel element/s.

45 Claims, 26 Drawing Sheets

U.S. PATENT DOCUMENTS

| | | |
|---|---|---|
| 5,196,377 A | 3/1993 | Wagner et al. |
| 5,196,703 A | 3/1993 | Kennan |
| 5,220,188 A | 6/1993 | Higashi et al. |
| 5,260,225 A | 11/1993 | Liu et al. |
| 5,286,671 A | 2/1994 | Kurtz et al. |
| 5,286,976 A | 2/1994 | Cole |
| 5,288,649 A | 2/1994 | Keenan |
| 5,300,915 A | 4/1994 | Higashi et al. |
| 5,367,167 A | 11/1994 | Keenan |
| 5,367,194 A | 11/1994 | Beatty |
| 5,431,328 A | 7/1995 | Chang et al. |
| 5,449,910 A | 9/1995 | Wood et al. |
| 5,450,053 A | 9/1995 | Wood |
| 5,455,421 A | 10/1995 | Spears |
| 5,486,698 A | 1/1996 | Hanson et al. |
| 5,512,748 A | 4/1996 | Hanson |
| 5,534,111 A | 7/1996 | Hocker et al. |
| 5,539,206 A | 7/1996 | Schimert |
| 5,573,859 A | 11/1996 | Suppelsa |
| 5,589,688 A | 12/1996 | Kimura et al. |
| 5,602,393 A | 2/1997 | Gerard |
| 5,605,489 A | 2/1997 | Gale et al. |
| 5,659,195 A | 8/1997 | Kaiser et al. |
| 5,701,008 A | 12/1997 | Ray et al. |
| 5,726,480 A | 3/1998 | Pister |
| 5,729,016 A | 3/1998 | Klapper et al. |
| 5,760,398 A | 6/1998 | Blackwell et al. |
| 5,773,987 A | 6/1998 | Montoya |
| 5,777,328 A | 7/1998 | Gooch |
| 5,789,753 A | 8/1998 | Gooch et al. |
| 5,811,815 A | 9/1998 | Marshall et al. |
| 5,825,029 A | 10/1998 | Agnese et al. |
| 5,895,233 A | 4/1999 | Higashi et al. |
| 5,905,007 A | 5/1999 | Ho et al. |
| 5,912,464 A | 6/1999 | Vilain et al. |
| 5,915,168 A | 6/1999 | Salatino et al. |
| 5,919,548 A | 7/1999 | Barron et al. |
| 5,921,461 A | 7/1999 | Kennedy et al. |
| 5,923,995 A | 7/1999 | Kao et al. |
| 5,929,441 A | 7/1999 | Beratan et al. |
| 5,945,673 A | 8/1999 | Beratan et al. |
| 5,952,661 A | 9/1999 | Klocek |
| 5,965,890 A | 10/1999 | Hanson |
| 5,970,315 A | 10/1999 | Carley et al. |
| 6,028,312 A | 2/2000 | Wadsworth et al. |
| 6,034,371 A | 3/2000 | Kormos et al. |
| 6,036,872 A | 3/2000 | Wood et al. |
| 6,046,067 A | 4/2000 | Werner |
| 6,054,745 A | 4/2000 | Nakos et al. |
| 6,062,461 A | 5/2000 | Sparks et al. |
| 6,064,216 A | 5/2000 | Farnworth et al. |
| 6,087,199 A | 7/2000 | Pogge et al. |
| 6,100,525 A | 8/2000 | Eden |
| 6,111,254 A | 8/2000 | Eden |
| 6,114,696 A | 9/2000 | Eden |
| 6,114,697 A | 9/2000 | Eden et al. |
| 6,119,920 A | 9/2000 | Guthrie et al. |
| 6,133,570 A | 10/2000 | Schimert et al. |
| 6,143,997 A | 11/2000 | Feng et al. |
| 6,157,404 A | 12/2000 | Marshall et al. |
| 6,159,812 A | 12/2000 | Cheek et al. |
| 6,210,988 B1 | 4/2001 | Howe et al. |
| 6,232,044 B1 | 5/2001 | Gibbons et al. |
| 6,232,150 B1 | 5/2001 | Lin et al. |
| 6,316,770 B1 | 11/2001 | Ouvrier-Buffet et al. |
| 6,320,189 B1 | 11/2001 | Ouvrier-Buffet et al. |
| 6,392,232 B1 | 5/2002 | Gooch et al. |
| 6,437,332 B2 | 8/2002 | Gibbons et al. |
| 6,479,320 B1 | 11/2002 | Gooch |
| 6,521,477 B1 | 2/2003 | Gooch et al. |
| 6,586,831 B2 | 7/2003 | Gooch et al. |
| 6,690,014 B1 | 2/2004 | Gooch et al. |
| 6,777,681 B1 | 8/2004 | Schimert et al. |
| 6,897,469 B2 | 5/2005 | Syllaios et al. |
| 7,102,832 B2 | 9/2006 | Kormos et al. |
| 2003/0168599 A1 | 9/2003 | Liddiard |
| 2004/0219764 A1 | 11/2004 | Syllaios et al. |
| 2007/0170360 A1 | 7/2007 | Gooch et al. |
| 2007/0170363 A1 | 7/2007 | Schimert et al. |

FOREIGN PATENT DOCUMENTS

| | | |
|---|---|---|
| EP | 0951069 A1 | 10/1999 |
| EP | 0971219 A1 | 1/2000 |
| EP | 0977275 A1 | 2/2000 |
| EP | 1072875 A1 | 1/2001 |
| EP | 1130646 A1 | 9/2001 |
| FR | 2780200 | 12/1999 |
| WO | WO99/50905 | 10/1999 |
| WO | WO99/67818 | 12/1999 |

OTHER PUBLICATIONS

Walker, "VisGaAs Camera Sees Red . . . And More", R&D Magazine, Mar. 2004, 2 pgs.

Roland Gooch, Anthanasios Syllaios, Thomas Schimert, and William McCardel, Copending Application, "Systems And Methods For Bonding", U.S. Appl. No. 11/607,087, Filed Nov. 30, 2006, 77 pgs.

John Brady, Anthanasios Syllaios, Thomas Schimert, William McCardel and Roland Gooch, Copending Application, "Color Correction For Radiation Detectors", U.S. Appl. No. 11/607,122, Filed Nov. 30, 2006, 76 pgs.

Thomas Schimert, Anthanasios Syllaios, William McCardel, and Roland Gooch, Copending Application, "Infrared Detector Elements And Methods For Forming Same", U.S. Appl. No. 11/606,621, FIled Nov. 30, 2006, 78 pgs.

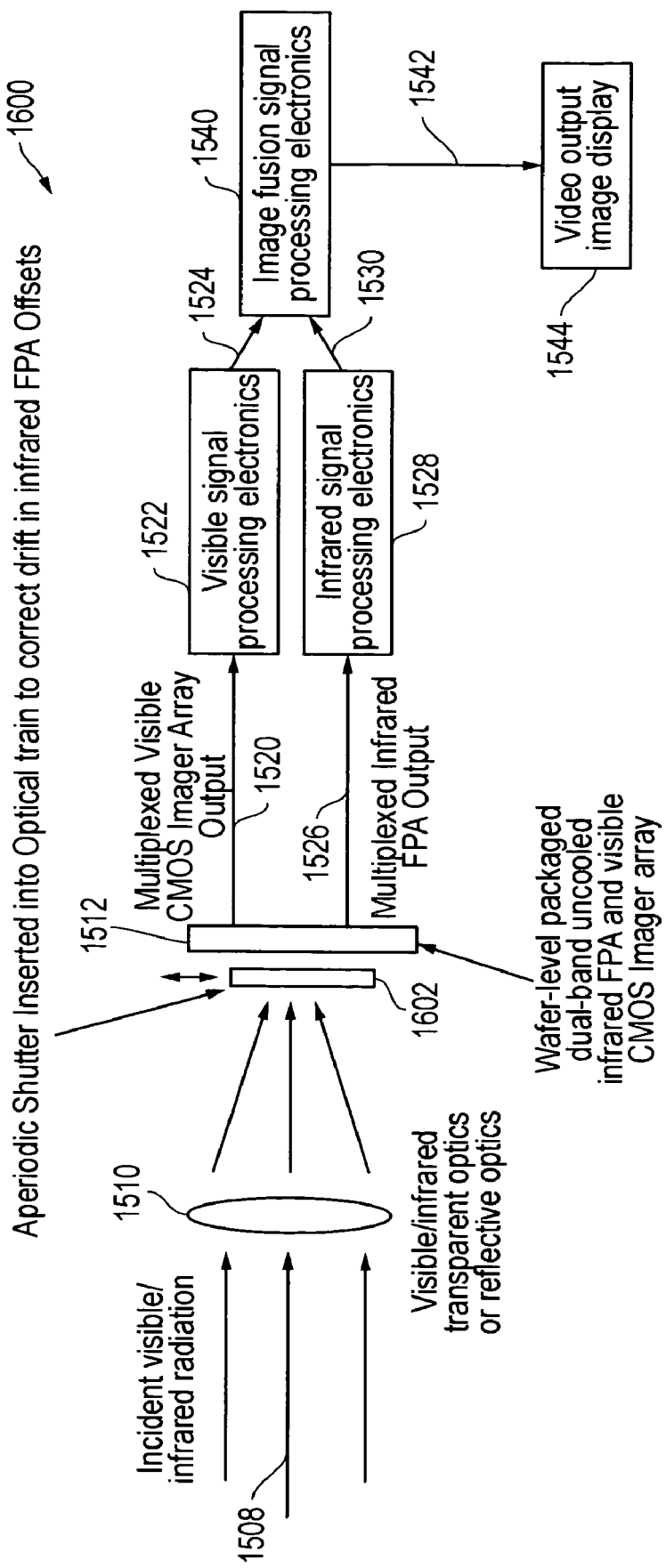
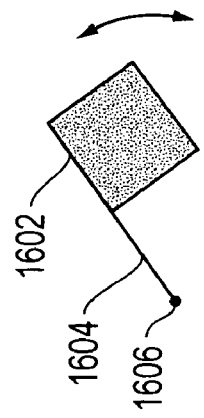
FIG. 16A
FIG. 16B

SYSTEMS AND METHODS FOR INTEGRATING FOCAL PLANE ARRAYS

This patent application claims priority to U.S. Provisional patent application Ser. No. 60/762,252, filed Jan. 26, 2006, and entitled "SYSTEMS AND METHODS FOR INTEGRATING FOCAL PLANE ARRAYS" by Syllaios et al., the entire disclosure of which is incorporated herein by reference.

FIELD OF THE INVENTION

This invention relates generally to detectors, and more particularly to focal plane arrays for detectors.

BACKGROUND OF THE INVENTION

Infrared (IR) detectors are often utilized to detect fires, overheating machinery, planes, vehicles, people, and any other objects that emit thermal radiation. Infrared detectors are unaffected by ambient light conditions or particulate matter in the air such as smoke or fog. Thus, infrared detectors have potential use in night vision and when poor vision conditions exist, such as when normal vision is obscured by smoke or fog. IR detectors are also used in non-imaging applications such as radiometers, gas detectors, and other IR sensors.

A variety of infrared detector types have been developed in the past. Many include a substrate having thereon a focal plane array (FPA), the focal plane array including a plurality of detector elements that each correspond to a respective pixel. The substrate contains an integrated circuit which is electrically coupled to the detector elements, and which is commonly known as a read out integrated circuit (ROIC).

Infrared detectors generally operate by detecting the differences in thermal radiance of various objects in a scene. That difference is converted into an electrical signal which is then processed. Microbolometers are infrared radiation detector elements that are fabricated on a substrate material using traditional integrated circuit fabrication techniques. Microbolometer detector arrays consist of thin, low thermal mass, thermally isolated, temperature-dependent resistive membrane structures. They are suspended over silicon ROIC wafers by long thermal isolation legs in a resonant absorbing quarter-wave cavity design.

Conventional infrared detector arrays and imagers operating at ambient temperature include microbolometer arrays made of thin films of hydrogenated amorphous silicon (a-Si:H) or amorphous vandium oxide (VOx). Other materials used for microbolometer arrays include films of various metal (e.g., titanium) and high temperature superconductors. For an array based on amorphous silicon, the detector pixel membrane is generally comprised of an ultra-thin (~2000 Å) a-$SiN_x$/a-Si:H/a-$SiN_x$ structure. The membrane is deposited at a low temperature nominally below 400° C using silane ($SiH_4$) and ammonia ($NH_3$) precursors for the amorphous silicon nitride (a-$SiN_x$) layers, and using silane for the hydrogenated amorphous silicon (a-Si:H) layer. Hydrogen atoms from silane ($SiH_4$) molecules are the source of hydrogen content in the a-Si:H layer. A thin absorbing metal layer such as Titanium (Ti), Titanium-Aluminum alloy (TiAl), Nichrome (NiCr), black gold, or other material absorbing in the infrared band of interest, (e.g., at wavelength range of 1 micron to 14 micron), is inserted in the membrane to enhance infrared absorptance. Contact between the a-Si:H detector electrodes and the interconnect pads on a complementary metal oxide semiconductor (CMOS) signal processor of the ROIC is accomplished by thick aluminum tab metal interconnects.

After fabrication, microbolometers are generally placed in vacuum packages to provide an optimal environment for the sensing device. Conventional microbolometers measure the change in resistance of a detector element after the microbolometer is exposed to thermal radiation. Microbolometers have applications in gas detectors, night vision, and many other situations.

The primary factors affecting response time and sensitivity of microbolometers are thermal mass and thermal isolation. Microbolometer response time is the time necessary for a detector element to absorb sufficient infrared radiation to alter an electrical property, such as resistance, of the detector element and to dissipate the heat resulting from the absorption of the infrared radiation. Microbolometer sensitivity is determined by the amount of infrared radiation required to cause a sufficient change in an electrical property of the microbolometer detector element. Microbolometer response time is inversely proportional to both thermal mass and thermal isolation. Thus, as thermal mass increases, response time becomes slower since more infrared energy is needed to sufficiently heat the additional thermal mass in order to obtain a measurable change in an electrical property of the microbolometer detector element. As thermal isolation increases, response time becomes slower since a longer period of time is necessary to dissipate the heat resulting from the absorption of the infrared radiation. Microbolometer operating frequency is inversely proportional to response time. However, microbolometer sensitivity is proportional to thermal isolation. Therefore, if a specific application requires high sensitivity and does not require high operating frequency, the microbolometer would have maximum thermal isolation and minimal thermal mass. If an application requires a higher operating frequency, a faster microbolometer may be obtained by reducing the thermal isolation which will also result in a reduction in sensitivity.

To provide multi-spectral imaging capability, two physically separate infrared and visible imaging focal plane arrays have been employed. Images from the two separate focal plane arrays have been fused electronically using hardware and software. However, use of two separate focal plane arrays requires additional space and complicates the structure and circuitry of the imaging assembly.

Wafer level vacuum packaging is an enabling technology for low cost packaging of microelectromechanical systems (MEMS) devices that utilize a vacuum for operation. Such devices include IR bolometer detector arrays, RF resonant devices, and devices with moving parts that may be impeded by the presence of gas in the package. Alternatively, wafer level vacuum packaging is also usefully employed for packaging of devices that utilize a specific atmosphere and or pressure for mechanical damping. Some types of wafer level vacuum packaged MEMS devices are fabricated by attaching a lid wafer of optically transmissive material to a device wafer that includes MEMS devices (e.g., FPA devices) and associated circuitry. In such a configuration, the lid wafer provides an optically transmissive window above the MEMS devices.

MEMS devices that utilize a window that is optically transmissive in the IR spectrum may employ silicon-based material or other IR spectrum-transmissive wafer material for the material of the window of the lid wafer so that silicon-based device wafer and silicon-based lid wafer are thermally matched, i.e., having substantially same temperature coefficients of expansion (TCE). When performing wafer level packaging, little difference between TCE of a lid wafer material and TCE of a device wafer is allowable due to the relatively large diameter of the wafer and the large temperature change required for soldering (e.g., soldering with 80-20 gold-tin AuSn solder), anodic bonding (e.g., at temperatures greater than about 400° C.), and glass frit sealing (e.g., at temperatures from about 400 to about 500° C.).

However, those MEMS devices that require optical transmission in the visible spectrum utilize non-silicon-based window materials (i.e., materials that are primarily composed of a material other than silicon) that are optically transmissive for the visible spectrum. Due to thermal mismatch caused by differences in thermal expansion coefficients (e.g., TCE for silicon is $4.7 \times 10^{-6}/°$ C., TCE for ZnS=$6.14 \times 10^{-6}/°$ C., TCE for ZnSe=$7 \times 10^{-6}/°$ C.), lid wafers composed of such non-silicon-based visible spectrum-transmissive materials would be under high stress and fracture during bonding which would not be the case for silicon materials. Therefore, devices requiring optical transmission of the visible spectrum (e.g., for purposes of optical I/O) traditionally have employed standard hermetic ceramic or metal packages with an appropriate window bonded onto it, or bonded into a window frame that is then soldered or welded onto the package. However, such a configuration, results in an inherently costly package.

FIG. 20 shows a silicon substrate 2000 that includes CMOS circuitry layers 2030 formed thereon that are configured as individual detector element (or cells) 2060, 2062 and 2064 of an array area 2070 of a conventional focal plane array. In the illustrated embodiment, CMOS circuitry layers 2030 include first CMOS circuit metal layer 2002, second CMOS circuit metal layer 2004, and third CMOS circuit metal layer 2006, each of which are formed during CMOS processing. Third CMOS circuit metal layer 2006 is the top (i.e., last) CMOS circuit metal layer. CMOS circuitry layers 2030 also include first insulator layer 2003 (e.g., planarized oxide layer) between first and second CMOS circuit metal layers 2002 and 2004, and second insulator layer 2005 (e.g., planarized oxide layer) between second and third CMOS circuit metal layers 2004 and 2006, and passivation layer 2007 (e.g., planarized oxide/nitride passivation layer) adjacent third CMOS circuit metal layer 2006. CMOS nitride/oxide passivation layer 2012 is present over the last (or top) metal level layer 2006 in the CMOS circuitry, and input via structures 2016 are opened (e.g., via etching) in the final (or top) CMOS passivation layer to expose input pads 2050 of the top CMOS metal layer 2006.

In the conventional configuration of FIG. 20, a lead metal reflector layer 2014 is formed during post-CMOS bolometer fabrication as a non-CMOS metal layer over top CMOS passivation layer 2012. Also shown in FIG. 20 are electrically conductive metal via (plug) interconnects 2022 that are formed to extend through first insulator layer 2003 between first and second CMOS circuit metal layers 2002 and 2004, and electrically conductive metal via (plug) interconnects 2024 that are formed to extend through second insulator layer 2005 between second and third CMOS circuit metal layers 2005 and 2007. Electrically conductive metal via (plug) interconnects are, for example, TiW or copper.

SUMMARY OF THE INVENTION

Disclosed herein are systems and methods for providing multi-spectral image capability using an integrated multi-band focal plane array that in one embodiment may be configured as a single integrated multi-band focal plane array. In one embodiment, the disclosed systems and methods may be employed to simultaneously image in the visible spectrum and infrared spectrum using an integrated dual-band focal plane array, e.g., by imaging in the infrared spectrum using a suspended low thermal mass microbolometer structure and imaging in the visible spectrum using imager circuitry in the underlying read-out integrated circuitry of the focal plane array. In this embodiment, visible CMOS imaging circuitry may be placed within the CMOS circuitry used to readout the infrared microbolometer detector within the same pixel element. Other types of suitable visible imaging circuitry include, but are not limited to, charge coupled device (CCD) circuitry. The disclosed approach offers advantages to the existing conventional approach which is to use separate infrared and visible imaging FPAs and fuse the images electronically in hardware and software. In the practice of the disclosed systems and methods, other types of infrared detectors besides microbolometers may be implemented as alternative to microbolometers for multi-band FPAs including, but not limited to, ferroelectric detectors, pyroelectric detectors, thermal pile detectors, etc. Furthermore, integrated multi-band FPAs may be provided that are capable of imaging in more than two spectra, e.g., single integrated tri-band FPA that is capable of simultaneously imaging in the short-wave IR spectrum (from about 1 to about 3 microns), the mid-wave IR spectrum (from about 3 to about 5 microns), and the long-wave IR spectrum (from about 8 to about 12 microns).

As will be described further herein, a dual-band FPA may be configured in one exemplary embodiment so that visible radiation is allowed to reach underlying CMOS imaging circuitry through openings in the grid of suspended membrane of a diffractive resonant cavity (DRC) microbolometer. In another embodiment, a resonant cavity microbolometer design may be implemented which uses a continuous solid membrane structure with a single opening provided in the membrane directly over active CMOS imaging circuitry.

In one embodiment disclosed herein, visible complementary metal oxide semiconductor (CMOS) imaging circuitry may be placed within or otherwise integrated with CMOS circuitry that is provided to readout signals from an infrared microbolometer detector within the same pixel element of a focal plane array. In such an embodiment, an integrated dual-band FPA may simultaneously image in the visible spectrum using CMOS imager circuitry provided in the underlying ROIC and image in the infrared spectrum using a suspended low thermal mass microbolometer structure. In one exemplary embodiment, visible radiation may be allowed to reach the CMOS imaging circuitry through openings that may be provided in a grid of a suspended membrane of a diffractive resonant cavity (DRC) microbolometer. In an alternative exemplary embodiment, visible radiation may be allowed to reach the CMOS imaging circuitry through an opening provided in the continuous solid membrane structure of a resonant cavity microbolometer. In such an alternative implementation, an opening may be provided in the continuous solid membrane structure directly over the active CMOS imaging circuitry.

In those embodiments employing a DRC pixel, the thermal mass or heat capacity of the patterned DRC membrane structure is reduced relative to an unpatterned membrane structure, which has the effect or reducing the thermal response time of the suspended membrane structure. This characteristic may be implemented in one embodiment to enable high performing infrared bolometer elements with very short (e.g., less than about 5 milliseconds) time constant. Fast response pixels allow for higher frame rate operation of the infrared FPA (e.g., up to about 120 Hz). In addition, fast response time makes feasible the use of a periodic chopper together with a fast responding bolometer detector element.

In one embodiment disclosed herein, the last metal level in CMOS circuitry of a microbolometer may be itself employed as the lead metal layer. For example, the last metal layer may be configured to function as the lead metal reflector and input pad in the array area, and also to serve as part of the CMOS circuitry both within and outside the array area.

In one respect, disclosed herein is a multi-band detector element, including: a substrate; read out integrated circuitry (ROIC) disposed on the substrate, the ROIC including visible imaging circuitry configured to detect visible radiation; and an infrared radiation detector structure configured to absorb infrared radiation, the infrared detector structure including a membrane supported at a position spaced above the substrate, the membrane having at least one opening defined therein and configured to allow visible spectrum radiation to reach the visible imaging circuitry through the membrane.

In another respect, disclosed herein is a detector element, including: a substrate; read out integrated circuitry (ROIC) disposed on the substrate, the ROIC including visible imaging circuitry configured to detect visible spectrum radiation; a substantially planar infrared detector membrane, the membrane having a planar upper surface, the membrane having at least one opening defined therein that is configured to allow visible radiation to reach the visible imaging circuitry through the membrane; and at least one thermal isolation leg supporting the infrared detector membrane in a position that is spaced above the substrate, the thermal isolation leg having a first end positioned proximal to the membrane and a second end positioned distal to the membrane, an upper surface of the first end of the thermal isolation leg being configured to lie in the same plane as the upper surface of the second end of the thermal isolation leg. A substantial entirety of the upper surface of the at least one thermal isolation leg may be substantially planar and may be oriented in substantially parallel and substantially coplanar relationship with the planar upper surface of the substantially planar infrared detector membrane.

In another respect, disclosed herein is a focal plane array assembly, including: a substrate; and a plurality of multi-band detector elements, each of the plurality of multi-band detector elements including a membrane suspended over the substrate and read out integrated circuitry (ROIC) disposed on the substrate, the ROIC including visible imaging circuitry. The membrane of each of the multi-band detector elements may have at least one opening defined therein and may be configured to allow visible spectrum radiation to reach the visible imaging circuitry through the membrane.

In another respect, disclosed herein is a method of making a focal plane array assembly, including: providing a substrate; forming read out integrated circuitry (ROIC) on the first side of the substrate, the ROIC including visible imaging circuitry; forming a plurality of membrane structures on the substrate so that each of the membrane structures is suspended over the substrate with the ROIC disposed on the substrate; and forming at least one opening in each of the plurality of membrane structures, the opening being configured to allow visible spectrum radiation to reach the visible imaging circuitry through the membrane.

In another respect, disclosed herein is a multi-band detector element, including: a substrate; a first radiation detector structure disposed on the substrate, the first radiation detector structure configured to detect a radiation having a first wavelength; and a second radiation detector structure configured to absorb radiation having a second wavelength.

In another respect disclosed herein, a plurality of multi-band detector elements may be configured to provide a multi-band focal plane array, and a multi-band radiation detection system may be provided by positioning the multi-band focal plane array to receive visible spectrum radiation and infrared spectrum radiation from a radiation source. A periodic chopper or an aperiodic shutter may be optionally positioned between the multi-band focal plane array and the source of visible spectrum radiation and infrared spectrum radiation.

In another respect disclosed herein, a wafer-level packaged focal plane array assembly and method for making the same may be provided. The wafer-level packaged focal plane array assembly may include a lid wafer and a device wafer having a multi-band focal plane array. The lid wafer is at least partially transparent to visible and infrared radiation and is assembled to the device wafer so that the lid wafer allows visible radiation to reach the multi-band focal plane array through the lid wafer.

BRIEF DESCRIPTION OF THE DRAWINGS

FIG. 16A is a block diagram of a dual-band infrared/visible imaging system according to one embodiment of the disclosed systems and methods.

FIG. 16B is a simplified side view of an aperiodic shutter according to one embodiment of the disclosed systems and methods.

DESCRIPTION OF ILLUSTRATIVE EMBODIMENTS

Figure 1:
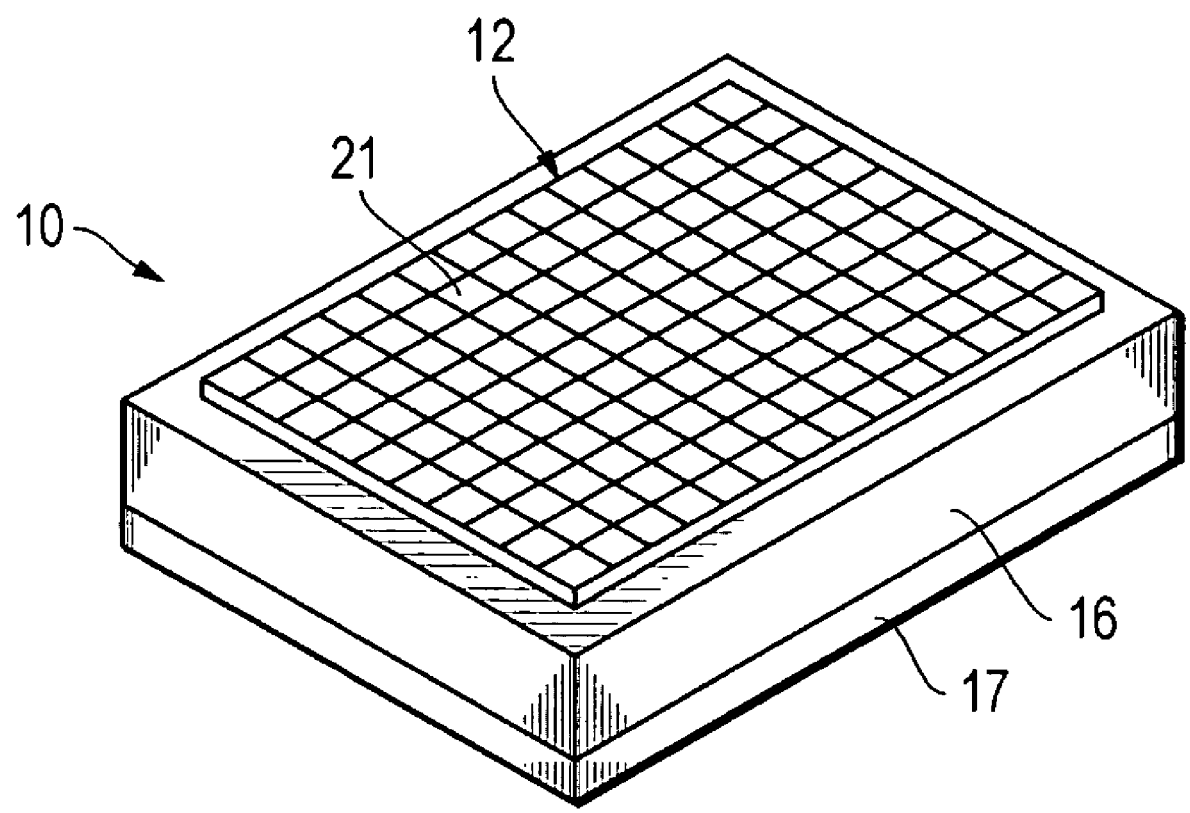
FIG. 1 is a perspective view of an infrared detector according to one embodiment of the disclosed systems and methods.
Figure 5:
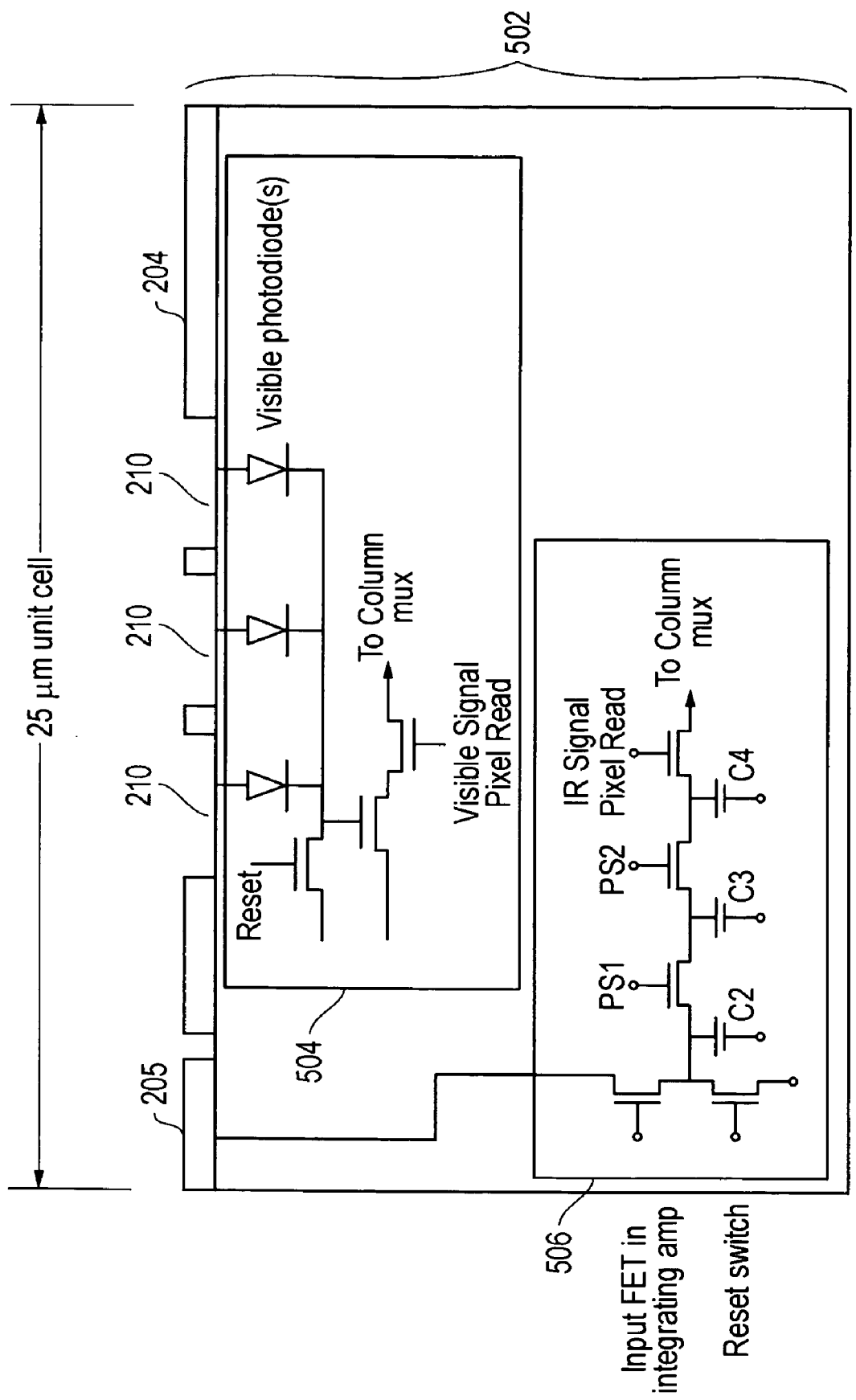
FIG. 5 is a cross-sectional representation of a read out integrated circuit (ROIC) showing lead metal reflector according to one embodiment of the disclosed systems and methods.

FIG. 1 is a diagrammatic perspective view of an multi-band detector 10 which may be configured as a dual-band detector according to one embodiment of the disclosed systems and methods to sense visible light and thermal energy and output electrical signals representative of a two-dimensional image of that sensed visible light and/or thermal energy. In this embodiment, the multi-band detector 10 includes a multi-band focal plane array (FPA) 12 disposed on a substrate 16. The substrate 16 includes a ROIC. As will be described further herein, the ROIC may be configured to detect signals representative of visible radiation from each detector element 21 in the focal plane array 12, to integrate the thermally induced electrical signals from each detector element 21 in the focal plane array 12, and to multiplex the signals off the array with the appropriate signal conditioning and processing, e.g., as shown in FIG. 5 with signals provided to column multiplexer (column MUX) via input pad 205.

As shown in FIG. 1, an optional thermal element 17 (e.g., active heat sink) may be provided on the side of the substrate 16 opposite from the focal plane array 12, in order to serve as a form of controlled heat sink which may be used, for example, to maintain the operating temperature of integrated circuit substrate 16 within a temperature range which may be predefined. However, it will be understood that thermal element 17 does not have to be present, and that no form of temperature stabilization is required in the practice of the disclosed systems and methods.

In one exemplary embodiment, the focal plane 12 may include a plurality of dual-band detector elements 21 that are each capable of both thermal-sensing and visible light-sensing. The detector elements are arranged in a two-dimensional array, and each detector element 21 corresponds to a respective pixel in each image detected by the dual-band detector 10. In one exemplary configuration, focal plane array 12 may include 76,800 dual-band detector elements 21, which are arranged in a 320 by 240 array, although a focal plane array may be of any other size depending as needed or desired for a particular application, e.g., ranging in size from greater than or equal to an 80×60 array up to megapixel-sized arrays. For clarity, however, FIG. 1 diagrammatically depicts only about 140 detector elements. It will be recognized that the total number of detector elements 21 in the focal plane array 12 may be larger or smaller. FIG. 1 shows the detector elements 21 arranged in a two-dimensional array. Examples of two-dimensional array configurations include, but are not limited to, arrays having a shape that is rectangular, octagonal, hexagonal, circular, etc. It will be understood that detector elements may alternatively be arranged in a one-dimensional (e.g., straight or curved line of mono-pixels) array, or may be provided at arbitrary locations that do not conform to a specific pattern.

FIGS. 2-10 relate to an integrated dual-band CMOS visible imaging and microbolometer infrared imaging FPA concept as it may be implemented according to the disclosed systems and methods. One exemplary embodiment of a dual-band detector element 21 of FIG. 1 is described in more detail with respect to FIGS. 2-5. In this regard, FIGS. 2-5 illustrate a dual-band detector element 21 as it may be configured as a combination visible CMOS imager and infrared microbolometer FPA imager that incorporates a diffractive resonant cavity infrared (IR) pixel design. It will be understood that a multi-band focal plane array (FPA) assembly may be configured with as a single FPA configured to detect any two or more different bands of radiation wavelength (e.g., dual-band, tri-band, quad-band, etc.).

In the exemplary embodiment of FIGS. 2-5, an integrated dual-band FPA may be configured to simultaneously image in the visible spectrum using CMOS imager circuitry in the underlying ROIC and to image in the infrared spectrum using a suspended low thermal mass microbolometer structure. A microbolometer pixel element having dimensions of about 25 microns×about 25 microns may be fabricated using a quarter wave diffractive resonant cavity (DRC) structure which exhibits high infrared absorptance even though the suspended membrane structure is patterned into a two dimensional grid structure with a periodic grid spacing of about 5.75 microns. This results in openings in the membrane structure of about 5 microns'about 5 microns in size which are capable of transmitting visible radiation to a region in the underlying ROIC which contains CMOS circuitry. In this embodiment, visible CMOS imager circuitry may be integrated within the CMOS circuitry in the ROIC region underlying the 5 micron×5 micron openings in the membrane structure to detect visible radiation. Using such a configuration, the same dual-band pixel cell may include a 25 micron×25 micron infrared imaging pixel element and one or more 5 micron×5 micron CMOS visible-imaging diodes. It will be understood that the foregoing pixel element and membrane structure opening dimensions are used for purposes of illustration and are exemplary only. Thus, pixel elements larger than about 25 microns× about 25 microns, or smaller than about 25 microns×about 25 microns are also possible, as are membrane structure openings and corresponding CMOS visible-imaging diodes that are larger than about 5 microns×about 5 microns, or smaller than about 5 microns×about 5 microns in size.

Figure 2:
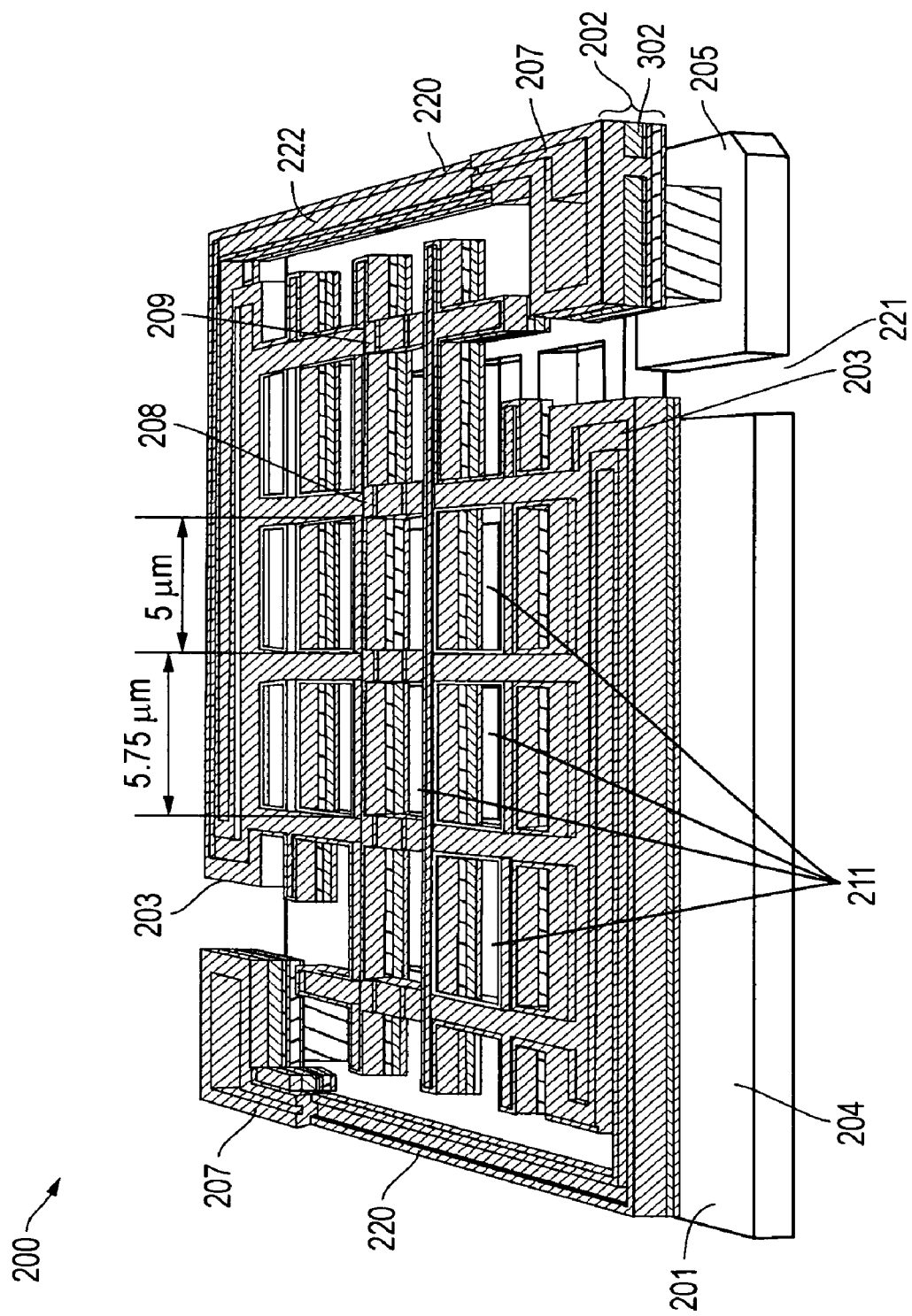
FIG. 2 is a perspective view of a multi-band detector element according to one embodiment of the disclosed systems and methods.
Figure 3:
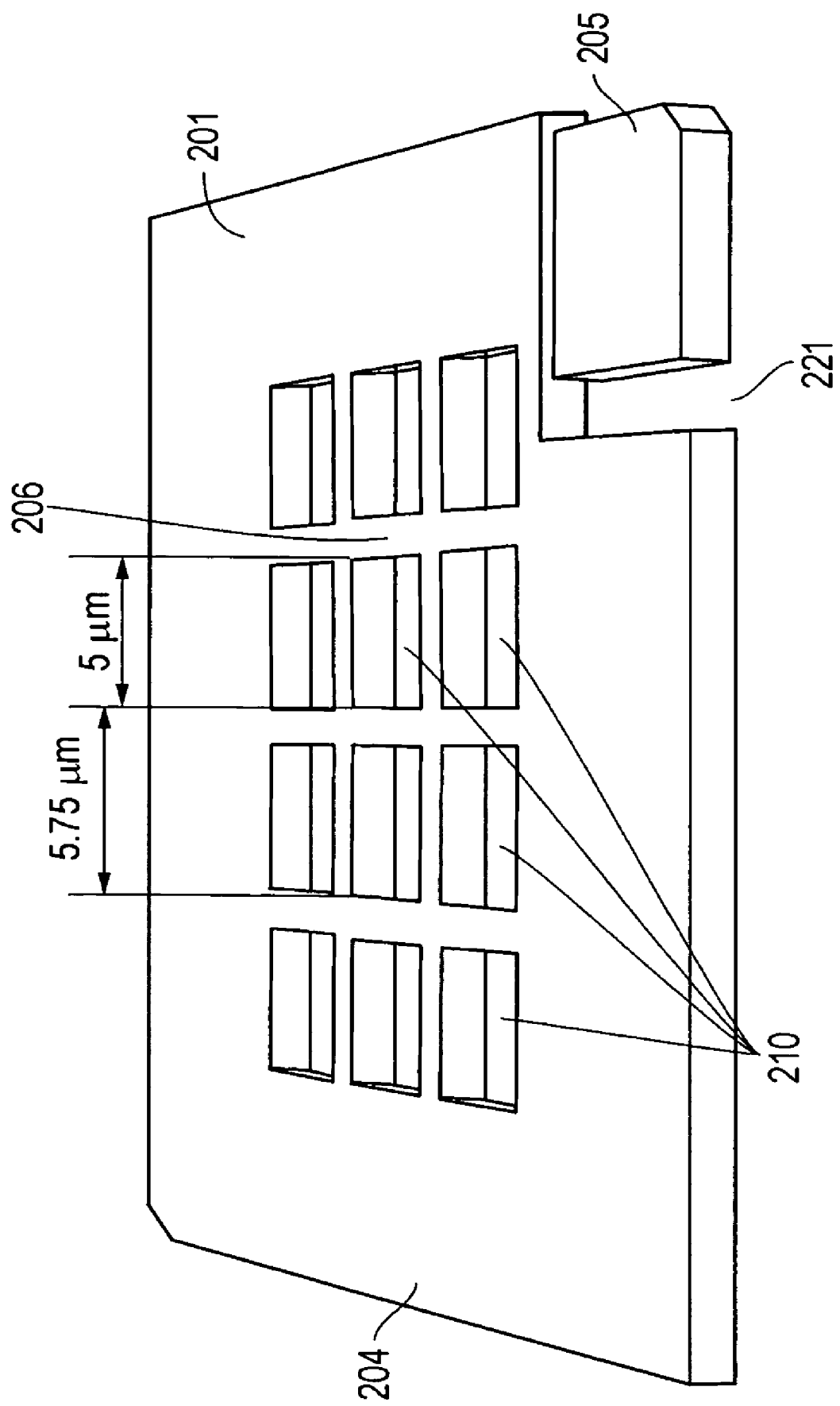
FIG. 3 is a perspective view of a lead metal reflector according to one embodiment of the disclosed systems and methods.

In one embodiment of the disclosed systems and methods illustrated in FIGS. 2 and 3, a detector element 200 is shown having DRC pixel 202 that is suspended over a patterned lead metal reflector 204 in a quarterwave cavity, and the patterned lead metal reflector 204 is shown having a grating structure 206 that is the same or similar to the suspended membrane structure 208, e.g., patterned into a two dimensional grid structure with grid spacing of about 5.75 microns. Such a suspended DRC pixel structure may include a suspended silicon nitride (SiN)/amorphous silicon (a-Si)/SiN or SiN/amorphous silicon germanium (a-SiGe)/SiN membrane structure in which a thin (e.g., less than about 200 Angstroms) infrared absorbing titanium aluminum (TiAl) layer is used to enhance absorptance of infrared radiation in the thin membrane structure.

In one exemplary implementation of the embodiment of FIGS. 2 and 3, the DRC pixel membrane structure 208 may be suspended about 2 microns above the infrared reflective lead metal layer 204 that is placed over a substantially planar ROIC surface which provides for an infrared absorbing resonant cavity structure with enhanced infrared absorptance. As shown, suspended DRC pixel membrane structure 208 may be configured with a grating structure formed by openings 211 that allow for transmission of visible radiation and infrared radiation having a wavelength that is shorter than dimensional size of opening 211 through the membrane structure 208. In one embodiment of a dual-band DRC pixel design disclosed herein, the lead metal infrared reflector 204 may be optionally patterned into a grating structure similar to the suspended DRC pixel membrane 208 so as to provide for an infrared reflecting surface, but with openings 210 to allow for the transmission of visible radiation to visible spectrum photodiodes present in the visible CMOS image circuitry 504 of the unit cell ROIC 502 positioned below the lead metal infrared reflector 204, e.g., as shown in cross section for the 25 micron unit cell in FIG. 5. This is in contrast to a single band infrared DRC pixel which employs a reflective lead metal without grating openings. As shown in the Figures herein, openings 210 may be configured in one exemplary embodiment to be substantially similar in shape and size as overlying openings 211, and openings 210 may be substantially aligned with openings 211, although this is not necessary.

Figure 19:
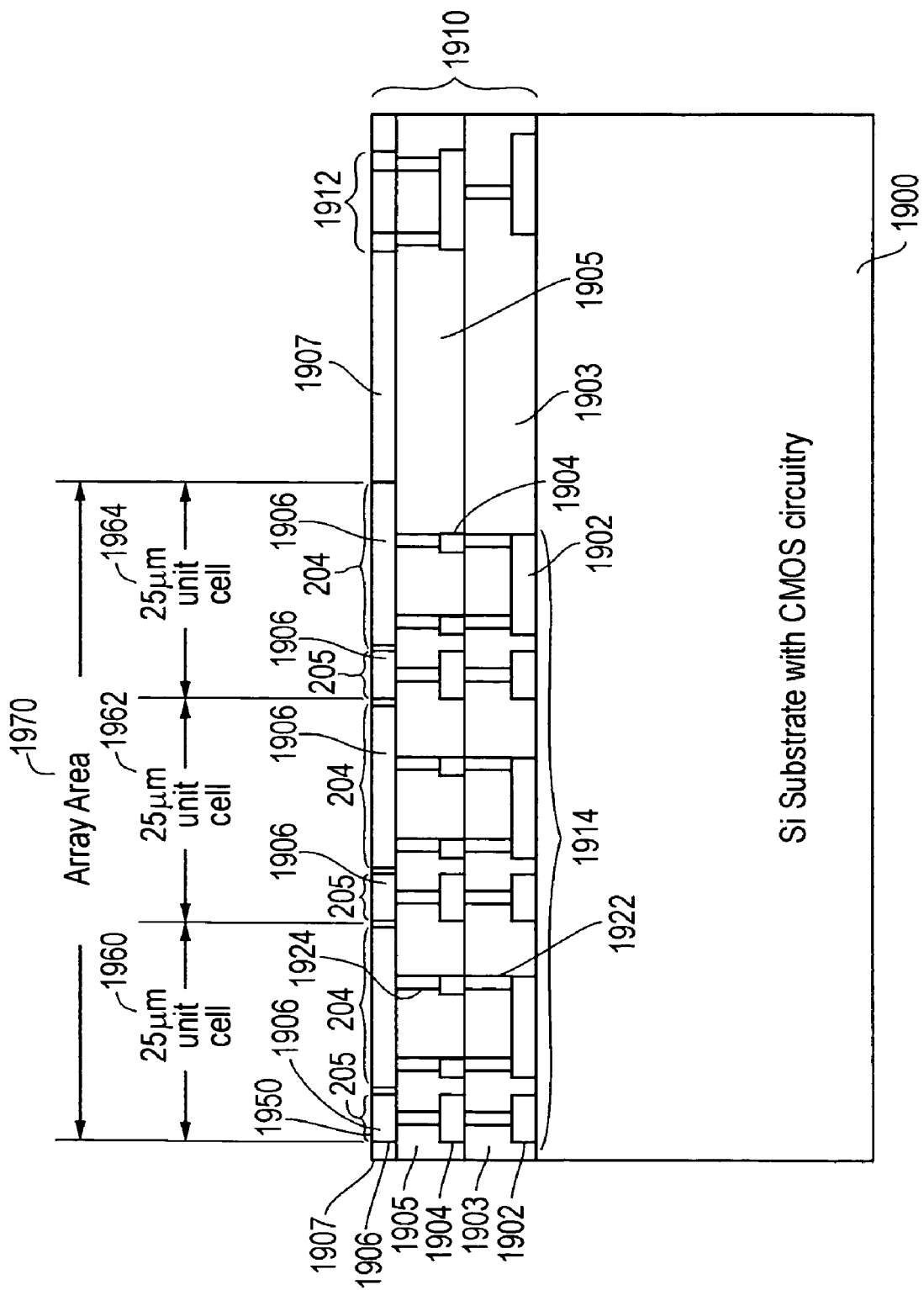
FIG. 19 is a side view of a silicon substrate with CMOS circuitry according to one embodiment of the disclosed systems and methods.

In one embodiment of the practice of the disclosed systems and methods, a lead metal reflector 204 may be a separate reflective layer that is placed over, or on top of, CMOS circuitry (or other circuitry such as BiCMOS circuitry, etc.) of the ROIC. However, in an alternative embodiment, the last metal level in the CMOS circuitry may be itself employed as the infrared microbolometer lead metal reflector layer 204 as shown in FIG. 19. Such an embodiment may be advantageously employed to provide a microbolometer lead metal reflector layer as part of CMOS processing, and without requiring the lead metal reflector layer to be later formed during microbolometer fabrication. Further, such an embodiment may be implemented to provide a microbolometer lead metal reflector layer for single band (infrared only) detector elements, as well as for dual-band detector elements such as described elsewhere herein. Furthermore, a single band detector element may be configured with pixel membrane and lead metal reflector structures such as illustrated in described in U.S. Pat. No. 6,777,681 and U.S. Pat. No. 6,690,014, each of which is incorporated herein by reference.

FIG. 19 shows a silicon substrate 1900 that includes CMOS circuitry layers 1910 formed thereon that are configured as individual detector element (or cells) 1960, 1962 and 1964 of an array area 1970 of a focal plane array. In the illustrated embodiment, CMOS circuitry layers 1910 include first CMOS circuit metal layer 1902, second CMOS circuit metal layer 1904, and third CMOS circuit metal layer 1906, each of which are formed during CMOS processing. Third CMOS circuit metal layer 1906 is the top (i.e., last) CMOS circuit metal layer that is at least partially exposed and, in one embodiment may be substantially completely exposed with substantially no other material formed thereon. For example, in one embodiment third CMOS circuit metal layer 1906 may be substantially completely exposed with substantially no other material formed thereon except for edge overlap of side wall passivation material disposed within opening/s 210 and moat area gap 221 formed between lead metal reflector 204 and input pad 205. In such a case a relatively small overlapping amount of such passivation material may be present on third CMOS circuit metal layer 1906 at edge/s of third CMOS circuit metal layer 1906 adjacent opening/s 210 and adjacent moat area gap 221 formed between lead metal reflector 204 and input pad 205.

As further shown in FIG. 19, CMOS circuitry layers 1910 also include first insulator layer 1903 (e.g., planarized oxide layer) between first and second CMOS circuit metal layers 1902 and 1904, and second insulator layer 1905 (e.g., planarized oxide layer) between second and third CMOS circuit metal layers 1904 and 1906, and final passivation layer 1907 (e.g., planarized oxide/nitride passivation layer) adjacent third CMOS circuit metal layer 1906. Also shown in FIG. 19 are electrically conductive metal via (plug) interconnects 1922 that are formed to extend through first insulator layer 1903 between first and second CMOS circuit metal layers 1902 and 1904, and electrically conductive metal via (plug) interconnects 1924 that are formed to extend through second insulator layer 1905 between second and third CMOS circuit metal layers 1905 and 1907. In this regard, electrically conductive metal via (plug) interconnects may be, for example, TiW, copper or any other suitable CMOS processing plug material. As indicated above, first and second insulator layers 1903 and 1905 may each be planarized silicon dioxide layers. However, any other suitable dielectric material/s may be employed for first and second insulator layers 1903 and 1905.

In FIG. 19, the last metal layer 1906 (which in this three-metal exemplary embodiment is the $3^{rd}$ metal in the CMOS circuitry) functions as the lead metal reflector 204 and also as the input pad 205 in the array area, and also serves as both part of the CMOS circuitry 1914 located within the array area and as part of the CMOS circuitry 1912 located outside the array area. In one exemplary embodiment, the metal layers in the CMOS circuitry may be Aluminum on an alloy of aluminum such as Aluminum Copper with a small amount of copper or Aluminum Silicon with a small amount of silicon. In such an embodiment, the aluminum or mostly aluminum alloys used in CMOS circuitry have the additional benefit of being excellent low loss reflectors of infrared radiation. In one exemplary embodiment, the last or top CMOS metal layer may be from about 0.25 micron to about 1 micron thick and may be applied using any suitable processing method, e.g., sputtering, etc. In another exemplary embodiment, electrically conductive metal via (plug) interconnect 1924 may be of a different material (e.g., at least one of TiW or copper) than a material (e.g., at least one of aluminum, aluminum copper or aluminum silicon) of at least partially exposed top metal layer 1906. In another exemplary embodiment, electrically conductive metal via (plug) interconnect 1924 may be formed during a different processing step than is top metal layer 1906, and/or electrically conductive metal via (plug) interconnect 1924 may be formed at a different time during processing than is top metal layer 1906.

In one exemplary embodiment of FIG. 19, the last metal layer 1906 in the CMOS circuitry may be used as the lead metal reflector in a manner that may be employed to result in excellent surface planarity. Using CMOS processing, an oxide layer (1903 or 1905) planarized using Chemical Mechanical Polishing (CMP) may be placed between metal layers 1902 and 1904, and between metal layers 1904 and 1906, together with metal via interconnects 1922 and 1924 as previously described. Also, after the last CMOS metal, an oxide/nitride passivation layer 1907 (e.g., which may be made the same thickness as the last metal layer of CMOS circuitry) may be deposited to passivate the etched metal sidewalls. As shown in FIG. 19, the resulting structure of this exemplary embodiment has an exposed upper surface 1950 that is substantially planar across the array area 1970. Further, exposed upper surface of top metal layer 1906 is substantially planar across each detector element (cell) 1960, 1962 and 1964 as shown. A planar surface is advantageous for fabrication of a microbolometer structure due to the fact that at linear pixel dimensions of about 30 microns or less, the width of the thermal isolation legs may be about 1 micron or less. When working with such structural dimensions, a planar surface helps to ensure, among other things, faithful printing of about 1 micron (or narrower) wide legs in a photolithographic resist coat, expose and develop process.

In a further exemplary embodiment, upper surface 1950 of FIG. 19 may be characterized as being substantially planar and substantially continuous in those areas of array area 1970 that are disposed between moat areas 221 and between any opening/s 210 that may be present in upper surface 1950, and in a further exemplary embodiment may be characterized as being substantially planar and substantially continuous across each detector element (cell) 1960, 1962 and 1964 between moat areas 221 and opening/s 210 of these cells. For example, FIG. 7B illustrates an embodiment in which an upper surface 201 of lead metal reflector 204 is substantially planar across a detector element (cell), and is substantially continuous across the detector element except at moat area 221. In another example, FIGS. 2B and 6B illustrate embodiments in which an upper surface 201 of lead metal reflector 204 is substantially planar across a detector element (cell), and is substantially continuous across the detector element except at moat area 221 and opening/s 210.

Figure 20:
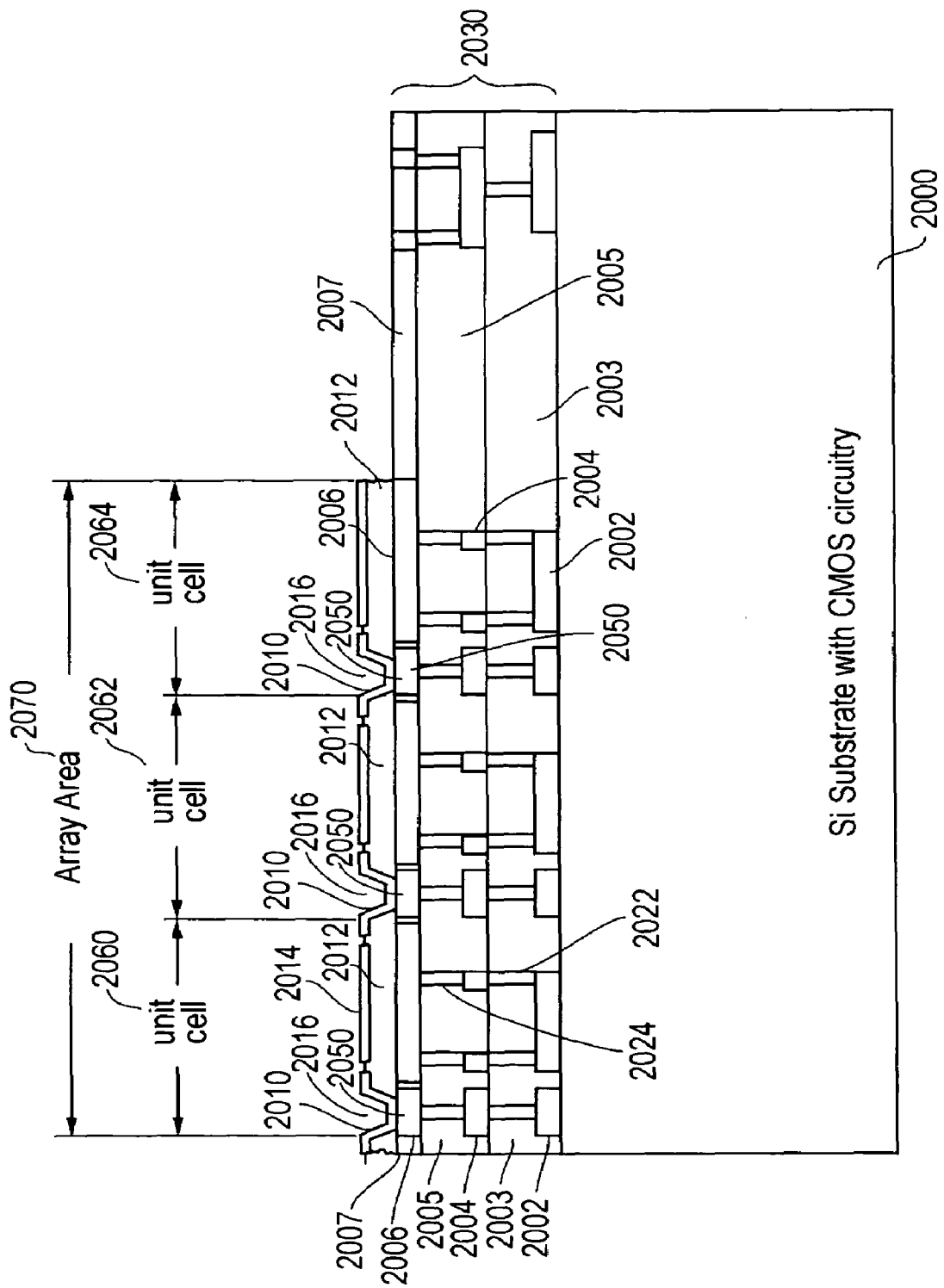
FIG. 20 is a side view of a silicon substrate with CMOS circuitry and non-CMOS lead metal reflector layer.

The embodiment of FIG. 19 may be implemented to provide a CMOS lead metal reflector layer and structure that is in contrast to the conventional structure of FIG. 20 in which portions 2010 of non-CMOS lead metal reflector layer 2014 are formed on sidewalls of input via structures 2016 and on top of top metal layer 2006 (i.e., to provide direct connection to metal of input pads 2050) so that the resulting non-CMOS lead metal reflector layer 2014 is non-planar at the location of the input via areas and is consequently not substantially planar across an array area of a focal plane array of detector elements. Further, the exemplary embodiment of FIG. 19 employs a lead metal reflector layer that is the same as top CMOS metal layer 1906 and that does not make intimate physical contact with any other metal layer, but instead is connected to other underlying CMOS layers by separately formed electrically conductive via interconnects. This is in further contrast to the conventional structure of FIG. 20 where the same metal of non-CMOS lead metal reflector layer 2014 is formed within input via structures 2016 so that non-CMOS lead metal reflector layer 2014 makes intimate physical contact with top CMOS metal layer 1906 and interconnect layers 2004 and 1906.

As shown in FIGS. 2-4, narrow-width (e.g., leg width of less than or equal to about 1 micron) legs 220 are each wrapped around two sides of the DRC pixel 202 to provide for high thermal isolation for the pixel. In one exemplary pixel structures may have linear dimensions of about 30 microns or less (i.e., the periodic spacing from cell to cell). However, linear dimensions of greater than about 30 microns are also possible.

As illustrated in the exemplary embodiment of FIGS. 2-4, each of the thermal isolation legs 220 of a multi-band detector element 200 may have an upper surface 222, the substantial entirety of which is substantially planar and oriented in substantially parallel relationship to the major plane of a corresponding suspended membrane 208. In one exemplary embodiment, each of the thermal isolation legs 220 of a multi-band detector may be oriented in substantial parallel and substantially coplanar relationship to the substantially planar upper surface 209 of a corresponding suspended membrane 208 of the detector. As so configured and shown in FIGS. 2 and 4A, the upper surface 222 of a first end 203 of each thermal isolation leg 220 (i.e., end located proximal to the membrane 208 and attached or otherwise contiguous to the upper surface 209 of the membrane 208) may be configured to lie in the same plane as the upper surface 222 of the opposite second end 207 of the thermal isolation leg 220 (e.g., opposite end located distal to the membrane 208 and attached or otherwise contiguous with an interconnect 302 to underlying ROIC circuitry). As illustrated, such a substantially planar thermal isolation leg structure may be advantageously configured for interconnection with underlying ROIC circuitry without stepping-down or ramping downward to the lead metal reflector 204 and/or substrate underneath (e.g., by using a separate interconnect structure/s such as a TiW interconnect/SiN capping structure combination, or using a TiW interconnect structure alone, to couple the end of the substantially planar leg to the lead metal or substrate). In the practice of the disclosed systems and method, each of the legs 220 of a DRC pixel 202 may additionally or alternatively be characterized as being oriented in substantially parallel relationship with a substantially planar upper surface 201 of a corresponding lead metal reflector 204.

Figure 4A:
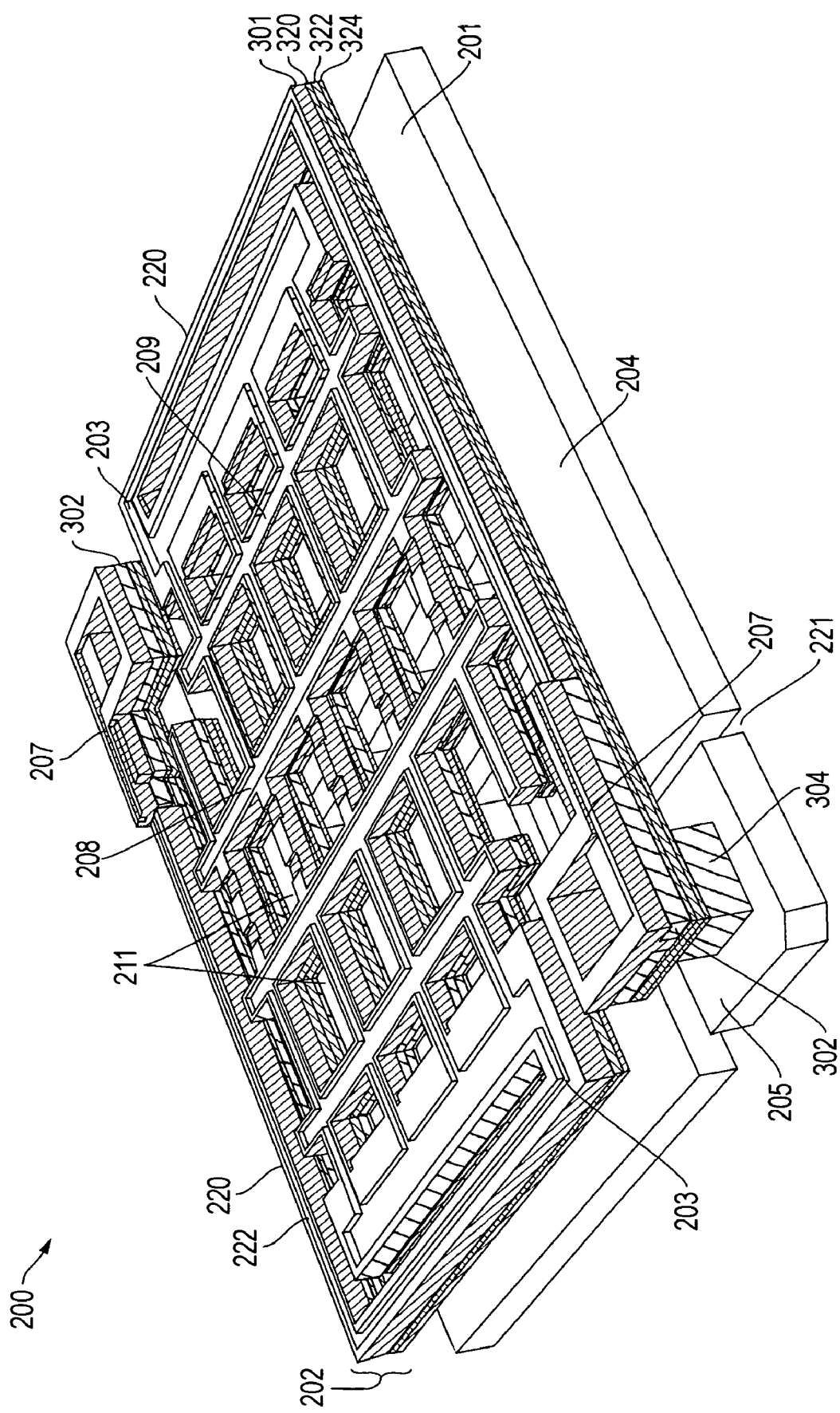
FIG. 4A is a perspective view of a multi-band detector element according to one embodiment of the disclosed systems and methods.
Figure 4B:
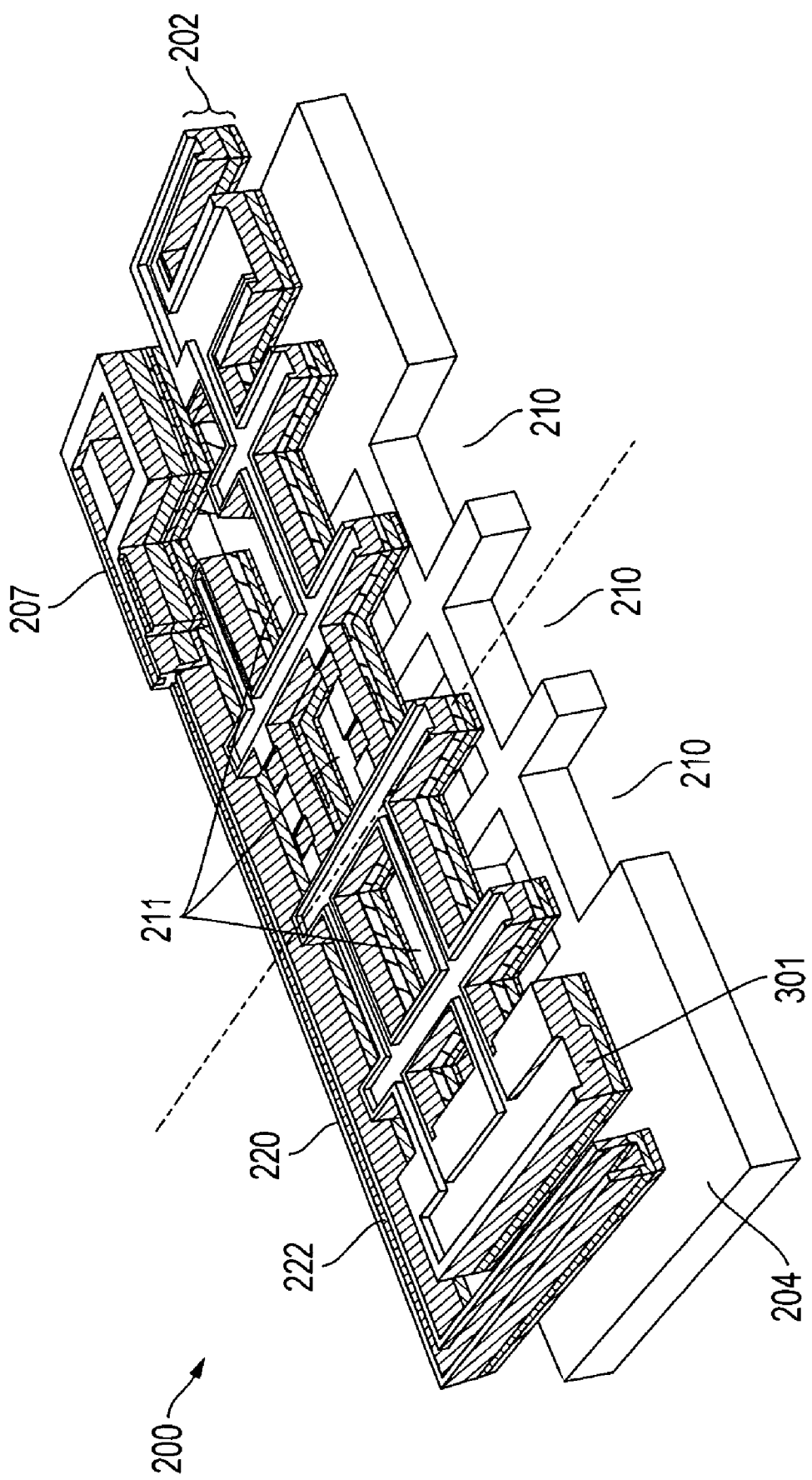
FIG. 4B is a perspective cross-sectional view of a multi-band detector element according to one embodiment of the disclosed systems and methods.
Figure 4C:
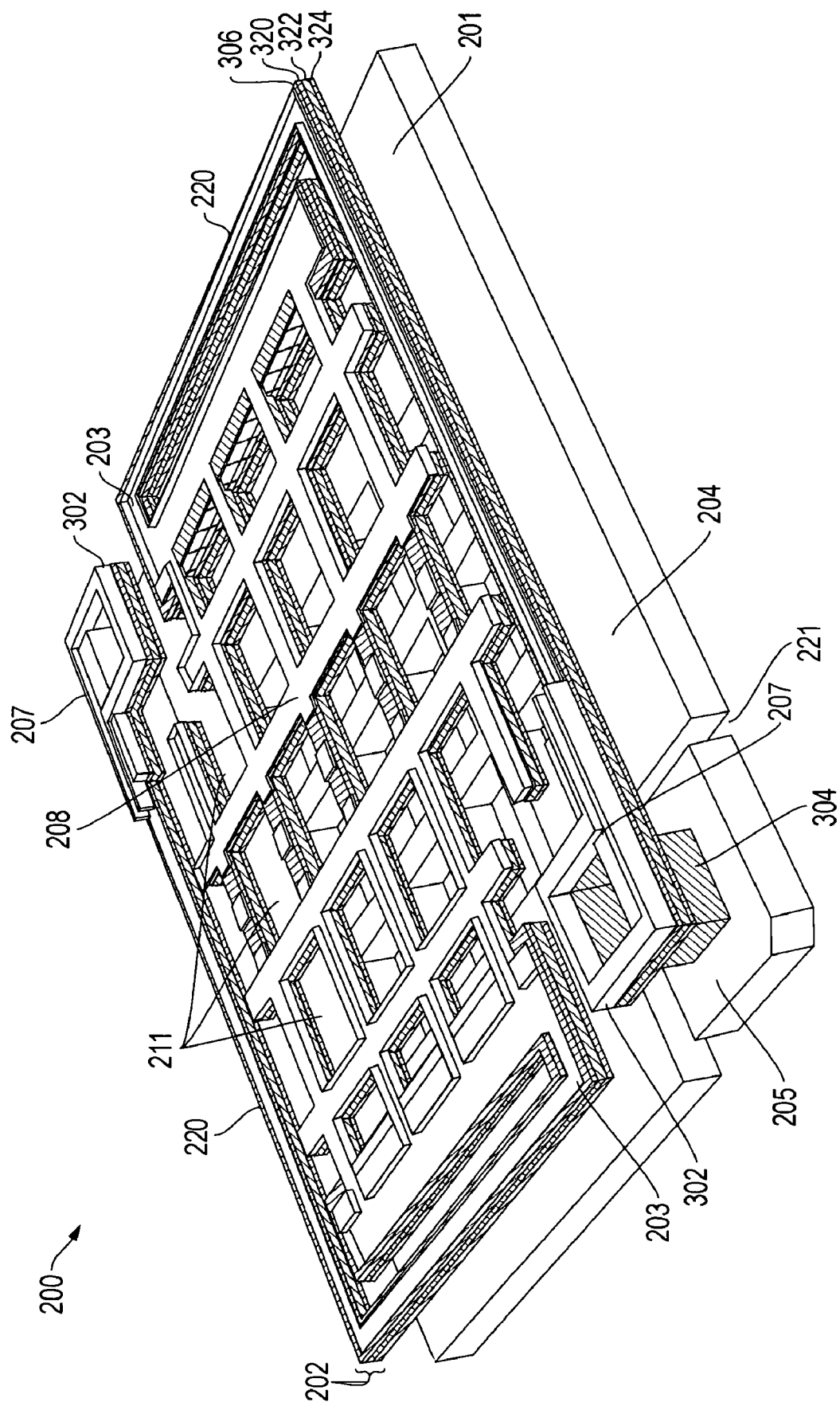
FIG. 4C is a perspective view of a partial multi-band detector element according to one embodiment of the disclosed systems and methods.
Figure 4D:
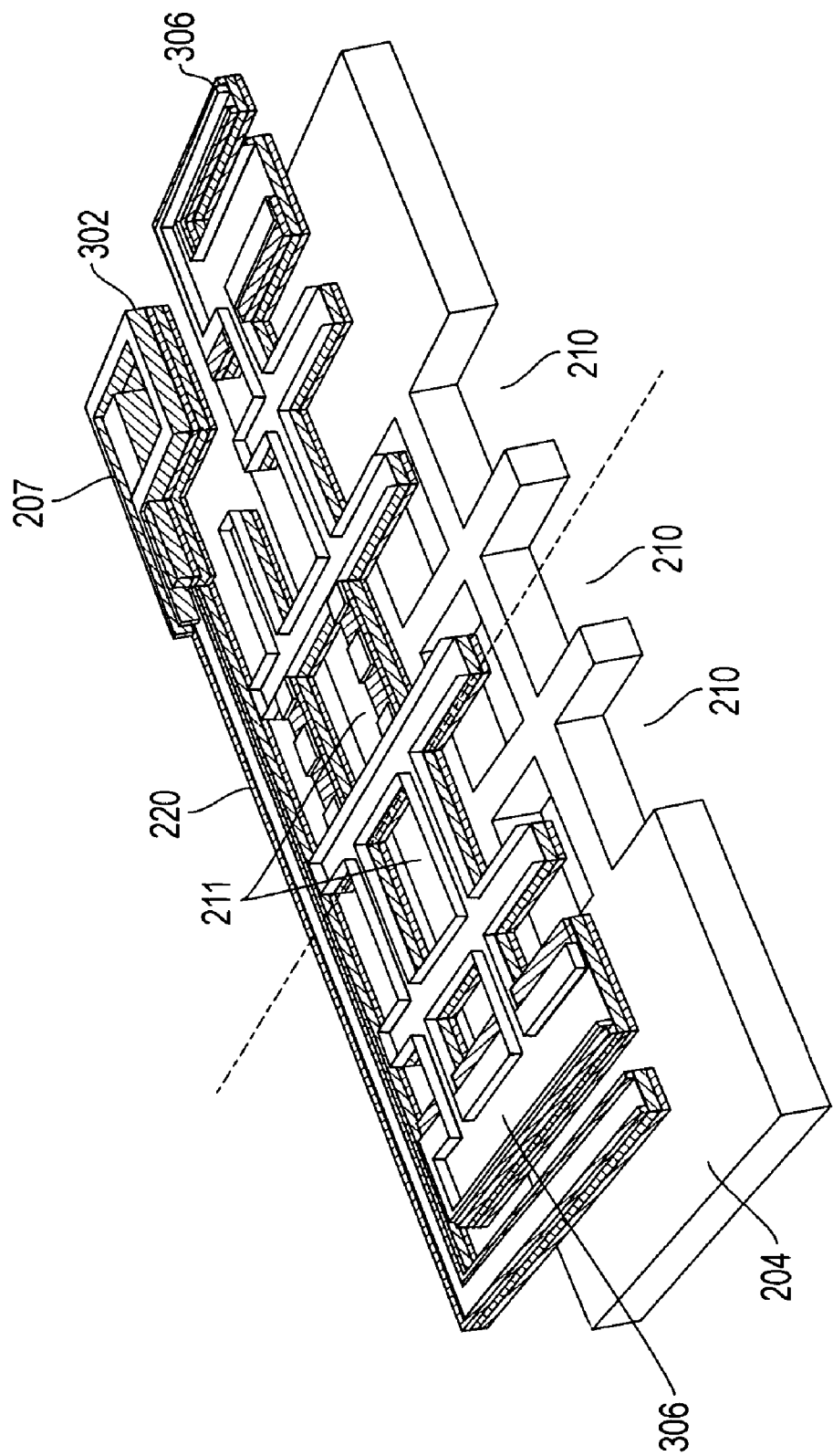
FIG. 4D is a perspective cross-sectional view of a partial multi-band detector element according to one embodiment of the disclosed systems and methods.
Figure 4E:
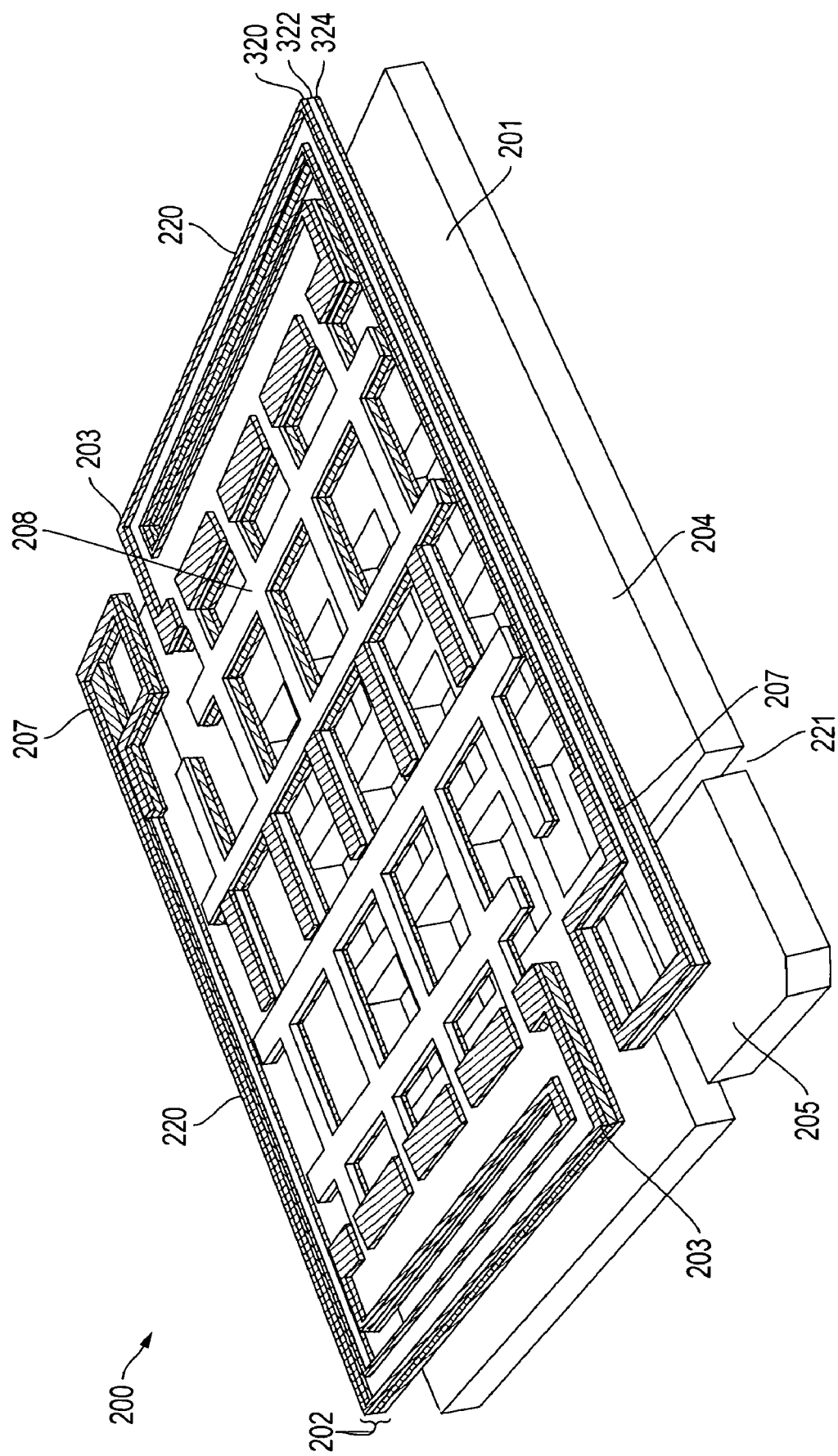
FIG. 4E is a perspective view of a partial multi-band detector element according to one embodiment of the disclosed systems and methods.
Figure 4F:
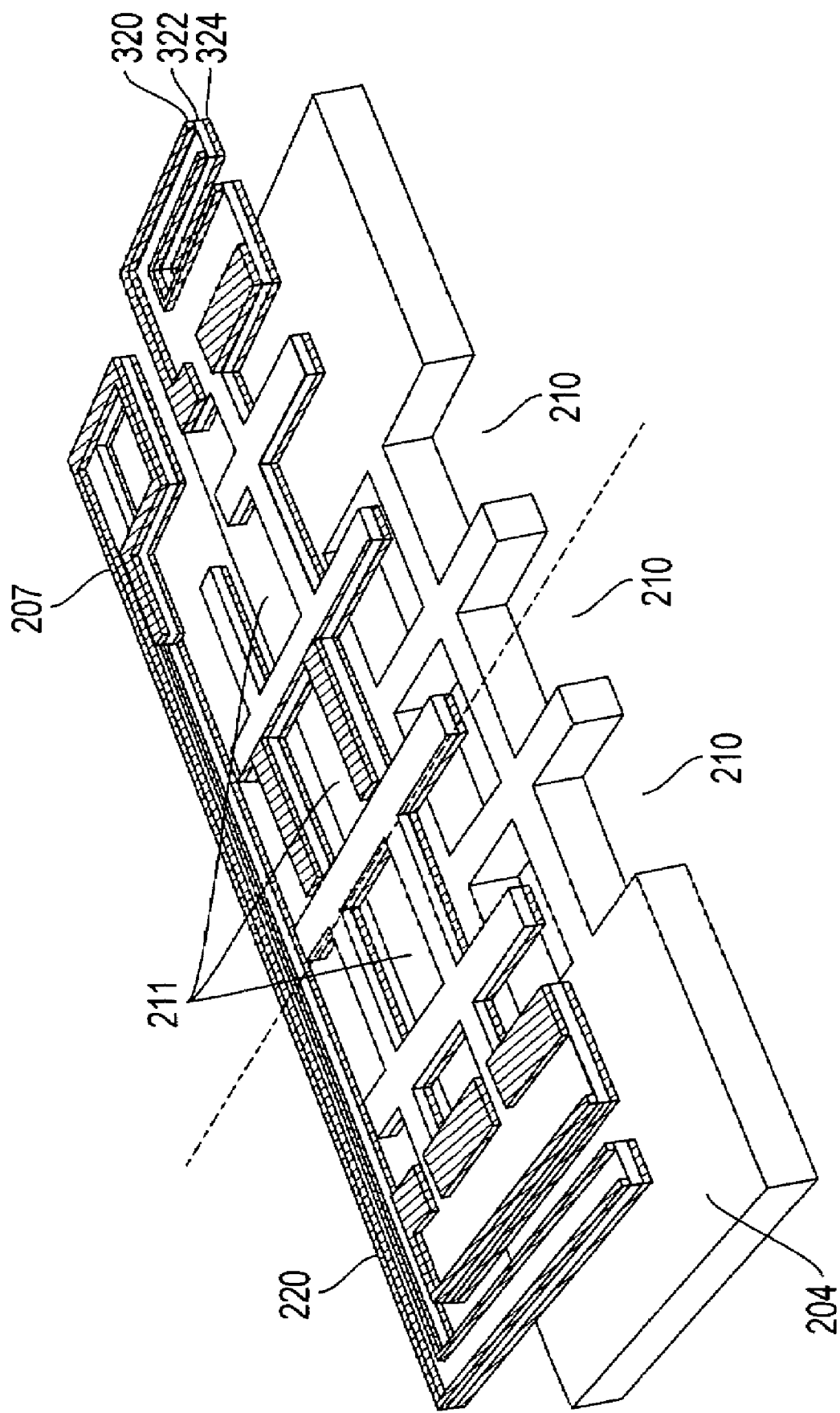
FIG. 4F is a perspective cross-sectional view of a partial multi-band detector element according to one embodiment of the disclosed systems and methods.

FIG. 4A shows a completed DRC pixel structure of multi-band detector element 200 having capping nitride (SiN) top layer 301, and FIG. 4B shows this structure in cross section. FIG. 4C shows DRC pixel structure of multi-band detector element 200 minus the capping SiN layer to expose titanium aluminum (TiAl) electrode absorber layers 304 and 306 and titanium tungsten (TiW) tab metal interconnect 302 formed above and connecting to input pad 205. FIG. 4D shows the structure of 4C in cross section. FIG. 4E shows DRC pixel structure of multi-band detector element 200 minus the capping SiN layer, TiAl electrode absorber, and TiW tab metal interconnect to expose patterned mid-SiN layer 320 formed over a layer 322 of amorphous silicon (a-Si) or amorphous silicon germanium (a-SiGe) that itself is formed over a first (bottom) SiN layer 324. FIG. 4F shows the structure of FIG. 4E in cross section.

As shown in FIG. 4C TiW tab metal interconnect 302 and TiAl electrode absorber 306 are provided to connect a distal end 207 (e.g., in this exemplary case the distal end 207 of the leg 220 is provided with a square terminal leg opening) of each leg 220 to ROIC circuitry 502 (e.g., see FIG. 5) and lead metal reflector structure 204. Advantageously, such a substantially planar leg configuration may be provided to increase process accuracy, especially for fabrication of structures having smaller geometries. Tighter depth of focus control in photolithographic printing becomes more important in faithfully printing smaller geometries, as does the process ability to remove areas of thicker photoresist in non-planar regions when exposure conditions are tightly controlled. In this regard, substantially planar leg configurations maybe employed in one embodiment to increase focus accuracy of photolithographic processes when fabricating legs of less than or equal to about 1 micron in width.

As shown in FIG. 5, the suspended planar DRC pixel 202 may be connected to the CMOS read out integrated circuit (Si ROIC) 502 which may include a CMOS infrared switched capacitor integrating amplifier circuit 506 per each unit cell for each pixel 202 to integrate infrared bolometer signal. As shown in FIG. 5, infrared switched capacitor integrating amplifier circuit 506 may be coupled to input pad 205 via an input field effect transistor (FET) and may be provided with a reset switch coupled for purposes of resetting the sampling circuit. Infrared switched capacitor integrating amplifier circuit 506 may also include integrating capacitor C2, transfer capacitor C3, and averaging capacitor C4 coupled as shown with switches PS1 and PS2 therebetween. Also shown is an output provided by circuitry 506 for a column by column multiplexer circuit to readout the infrared signal output via IR signal pixel read switch. FIG. 5 also shows how visible photodiodes of unit cell visible CMOS imager circuitry 504 may be positioned to receive visible spectrum radiation transmitted through openings 210 and to provide output signals for a column by column multiplexer circuit to readout the visible image signal and visible signal pixel read switch components. As shown, visible CMOS imager circuitry 504 also includes a reset switch component for purposes of resetting the input nodes.

Referring again to FIG. 2, the connection from the end of the long planar thermal isolation leg 220 (e.g., each leg having two perpendicular leg segments that are each about 20 microns in length for a total leg length of about 40 microns per leg) and the lead metal reflector 204 placed on top of the CMOS ROIC in each unit cell may be made in one embodiment by a Titanium-Tungsten (TiW) tab metal interconnect 302 of about 1750 Angstroms, although other configurations and dimensions are possible. The unit cell lead metal reflector 204 shown in FIG. 2 is shown provided with an input pad 205 which connects to the input of the CMOS ROIC integrating amplifier 506 of FIG. 5. In this embodiment, the large reflective area of the lead metal 204 in FIG. 2 may be connected to the detector common bias in the ROIC which allows the pixel 202 to be biased up to a voltage of about 1 to about 3 volts.

Various views and cross sections of one exemplary embodiment of DRC pixel structure are shown in FIGS. 2 through 4. The suspended membrane portion 208 of the DRC pixel 202, the amorphous silicon (a-Si) or amorphous silicon germanium (a-SiGe) layer 322 with a temperature dependent resistance may be sandwiched between the first SiN and mid-SiN layers 324 and 320, respectively. Contact windows may be patterned into the mid-SiN layer 320 to expose the a-Si or a-SiGe prior to the deposition of a thin TiAl layer 306. The TiAl layer 306 is subsequently patterned into the electrode absorber element. It is noted that the thin TiAl electrodes contribute to infrared absorptance thereby making the entire body and surface of the arms of the pixel 202 infrared absorbing. The patterned electrode/absorber may be covered with a capping layer 301 of SiN. The cap SiN layer 301 may be provided to not only passivate the TiAl metal, but also to provide additional stiffness to manage stress and maintain a planar, structurally robust suspended pixel element 202. In one embodiment illustrated herein, a thermal isolation leg 220 may have the same thickness and/or layer structure as the corresponding membrane 200 of the same pixel 202. However, it is also possible that the leg may be fabricated to have a different layer structure and/or thickness than the corresponding membrane of the same pixel.

The layer thicknesses and leg widths may vary depending on the size of the pixel 202. For example, a 25 micron×25 micron pixel 202 may have a first (bottom) SiN layer 324 of about 300 angstroms thick; an a-Si or a-SiGe layer 322 of about 600 angstroms thick; a middle SiN layer 320 of about 400 angstroms thick; and a capping SiN layer 301 of about 1000 angstroms thick; and may have a leg width of from about 0.5 microns to about 1 microns, it being understood that the forgoing width and thickness values are exemplary only. In one exemplary embodiment, the patterned suspended membrane 208 in the DRC pixel 202 exhibits high infrared absorptance (greater than about 80%) across the 8 to 12 micron long wave infrared spectral band. DRC pixel structures of the disclosed systems and methods may also exhibit high infrared absorptance (greater than about 80%) across the 3 to 5 micron mid wave infrared spectral band as well. Further information on detector elements or pixels having a diffractive resonant cavity may be found in U.S. Pat. No. 6,777,681, which is incorporated herein by reference.

In one exemplary embodiment, allocation of real estate in a 25 micron×25 micron unit cell such as illustrated in FIG. 5 may be as follows: the CMOS circuitry 506 for the infrared microbolometer may be configured to require about 289 microns squared, leaving as much as about 336 microns squared for the visible photodiode(s) and CMOS circuitry 504.

Figure 6A:
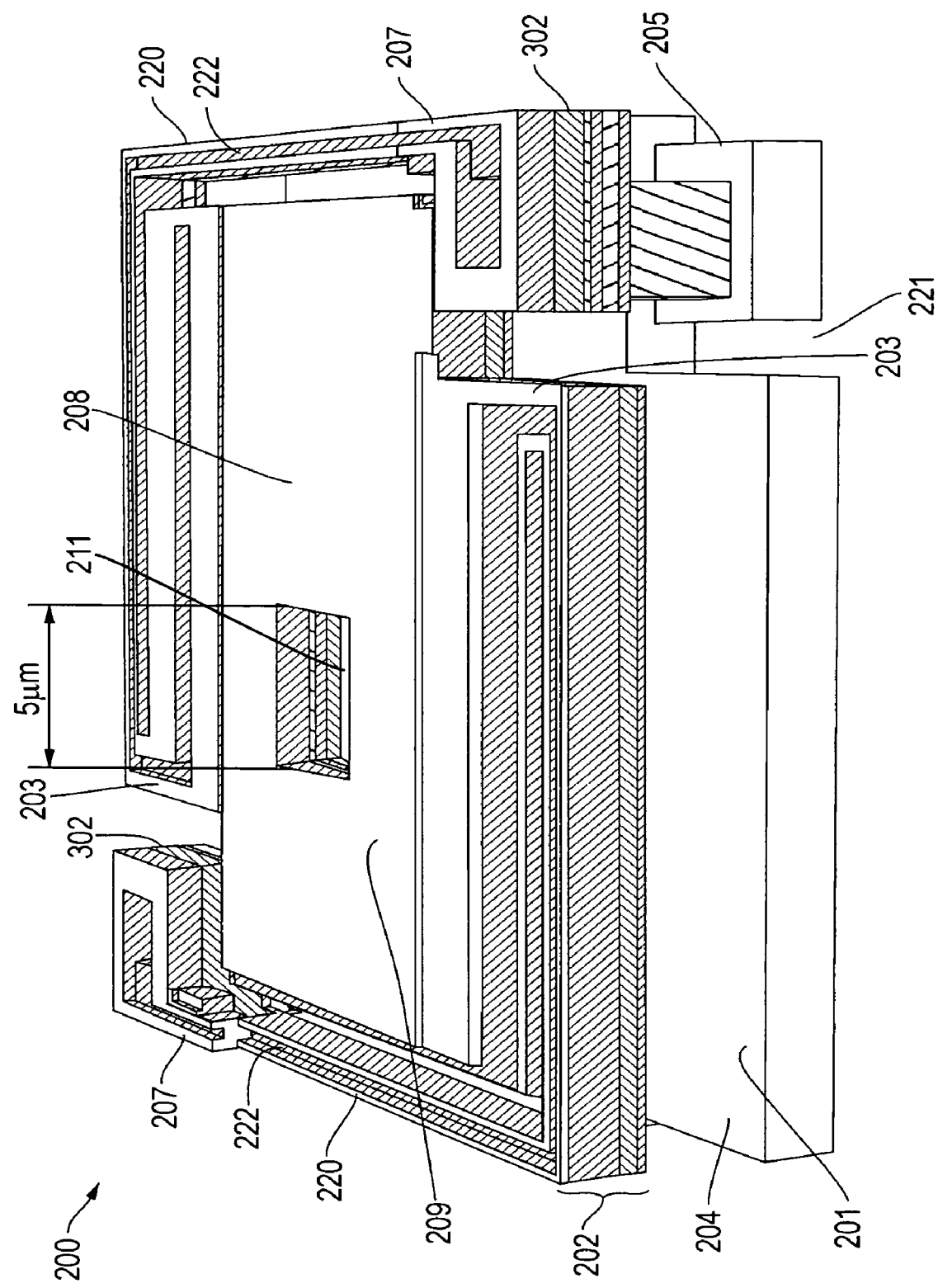
FIG. 6A is a perspective view of a multi-band detector element according to one embodiment of the disclosed systems and methods.
Figure 6B:
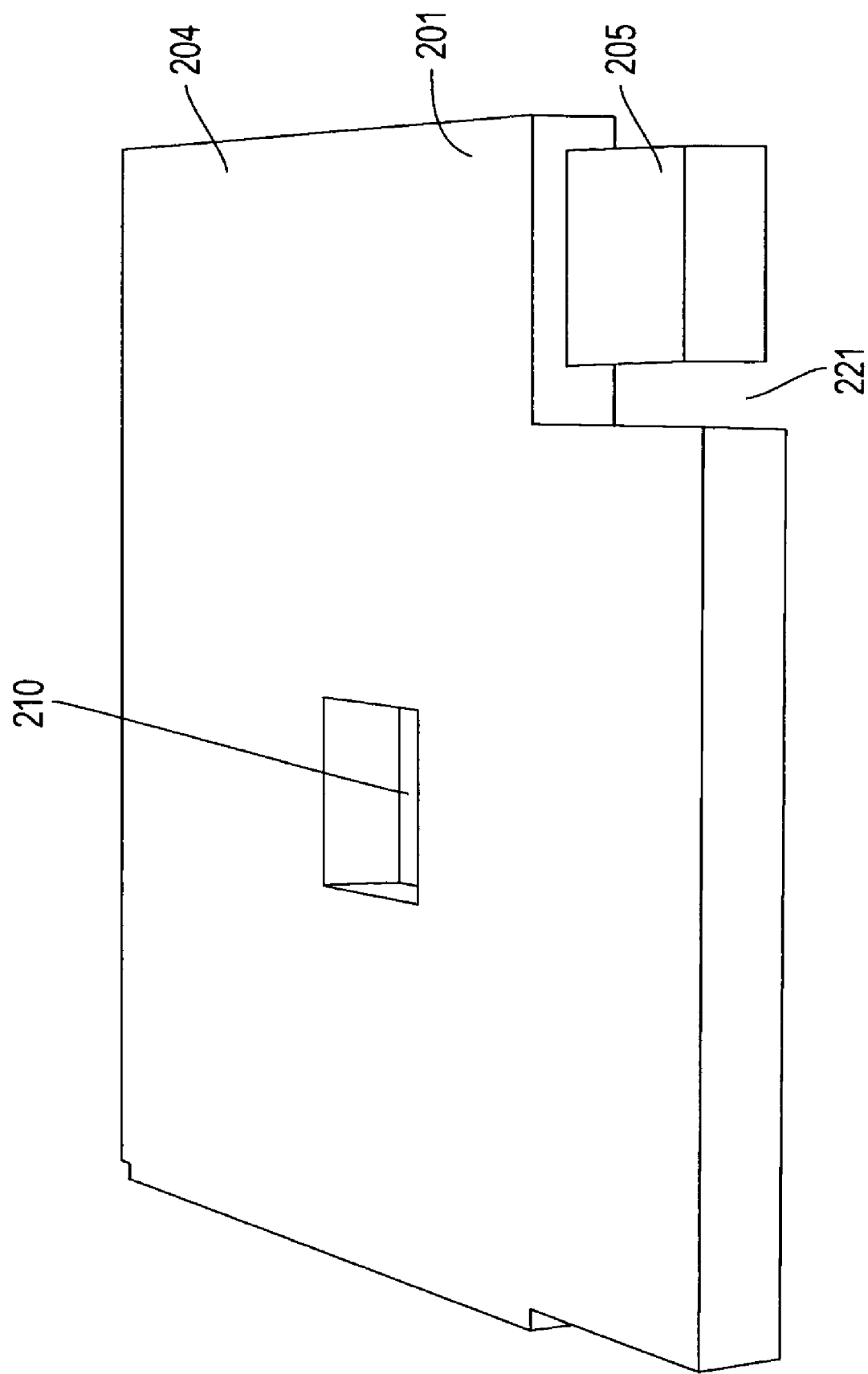
FIG. 6B is a perspective view of a lead metal reflector according to one embodiment of the disclosed systems and methods.

FIGS. 6A and 6B illustrate an alternative and exemplary embodiment of multi-band detector configured as a dual-band detector element 200 having a DRC microbolometer pixel (e.g., quarterwave cavity) design. In this embodiment, the dual-band detector element 200 includes a continuous solid membrane structure 208 that has a single opening 211 provided in the suspended membrane 208 directly over a single opening 210 provided in the lead metal reflector 204, and over active visible imaging circuitry. Single opening 210 provided in lead metal reflector 204 is shown in further detail in FIG. 6B. In the illustrated exemplary embodiment of FIGS. 6A and 6B, the openings 211 and 210 in both the suspended membrane 208 and the lead metal reflector 204 are square in shape with side dimensions of about 5 microns×about 5 microns, and are positioned in substantial optical alignment with each other so that visible spectrum radiation is transmitted.

Figure 8A:
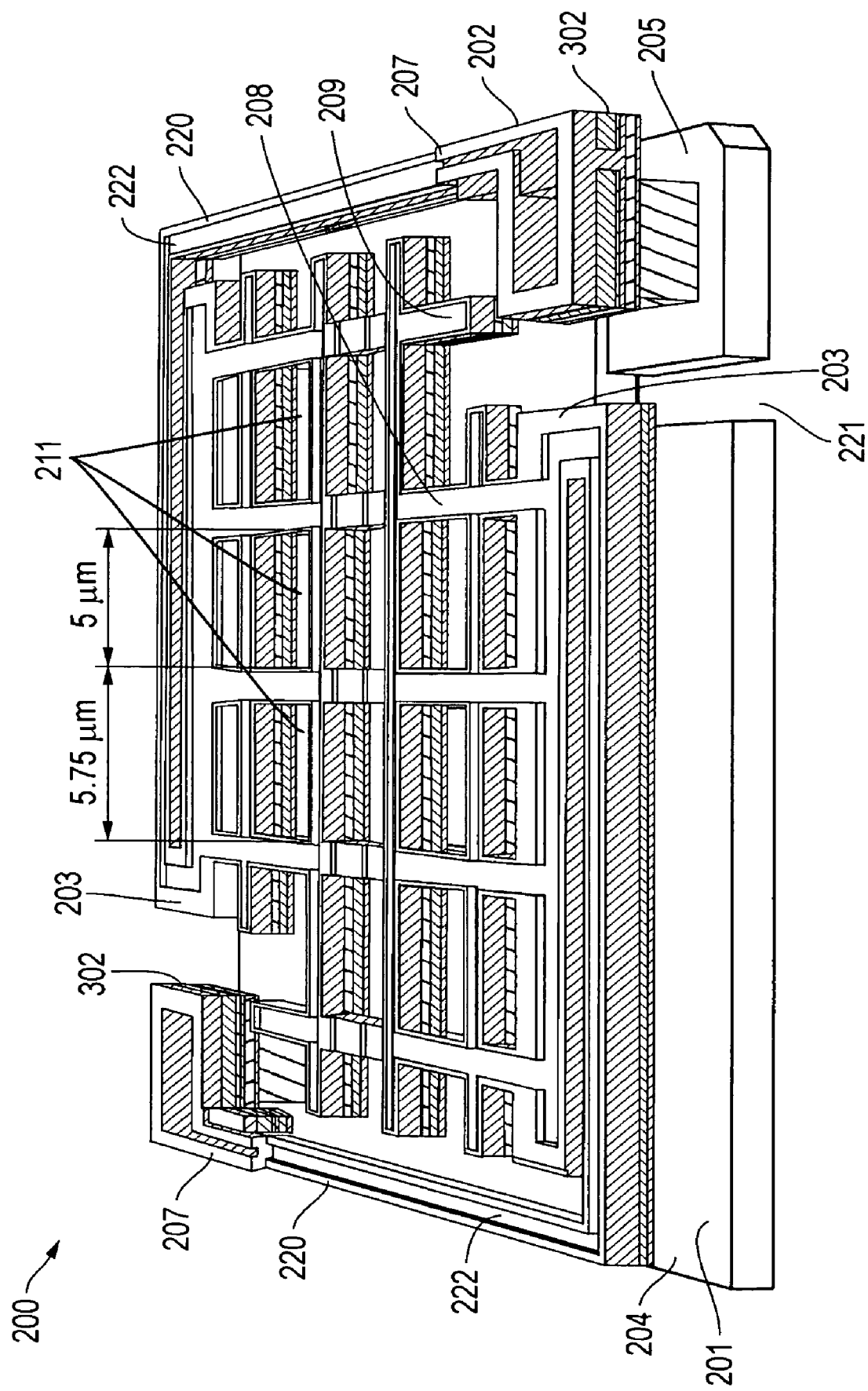
FIG. 8A is a perspective view of a multi-band detector element according to one embodiment of the disclosed systems and methods.
Figure 8B:
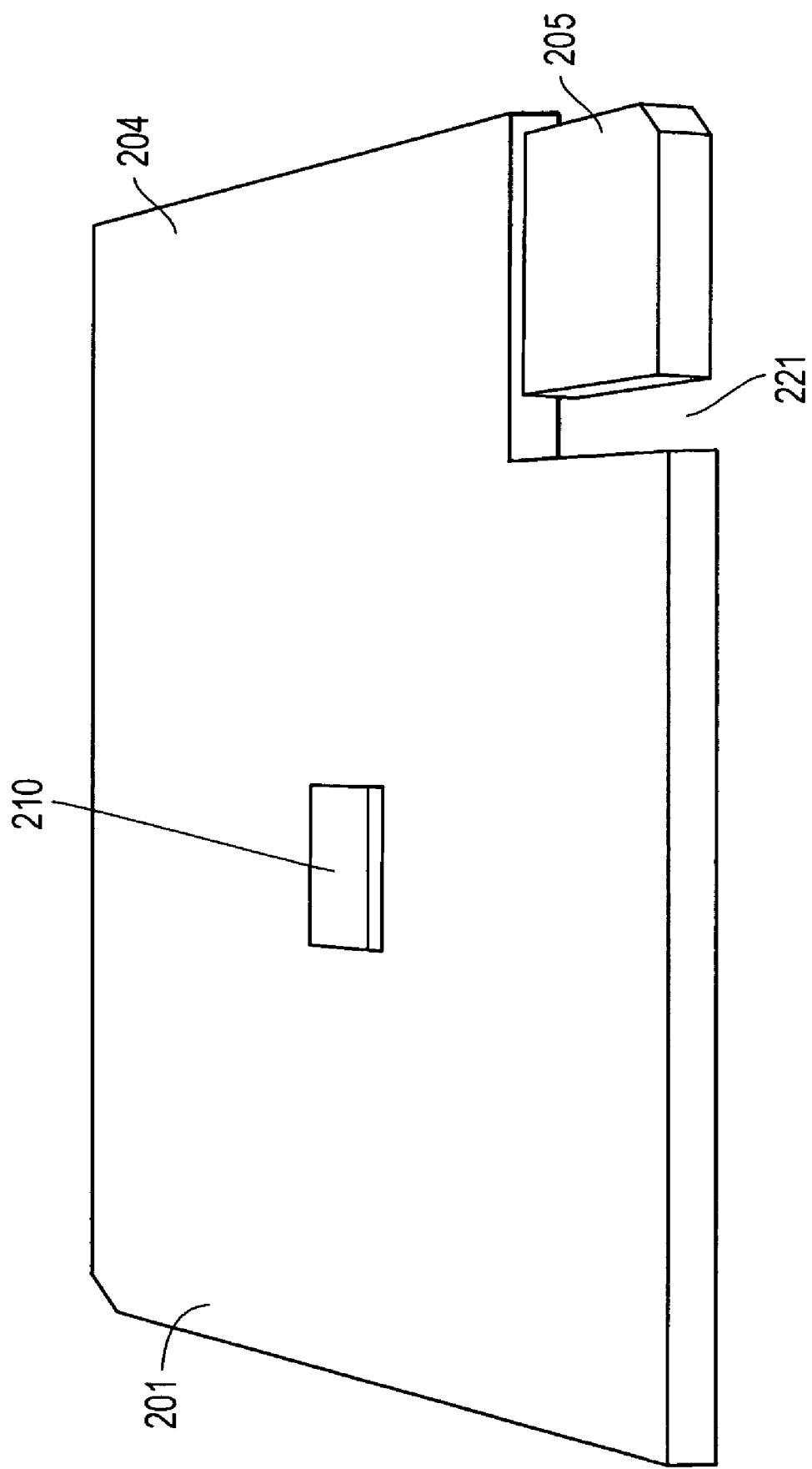
FIG. 8B is a perspective view of a lead metal reflector according to one embodiment of the disclosed systems and methods.

It will be understood, however, that membrane and lead metal reflector openings (or openings within any other type of underlying detector structure) of any other combination of shape, size and/or which are at least partial aligned, may be employed that are suitable for allowing visible energy to pass through to underlying visible imaging circuitry It will also be understood that it is not necessary for the number and/or size of openings in a membrane to be the same as the number and/or size of openings provided in a corresponding lead metal reflector or other underlying detector structure. For example, FIG. 8A shows another exemplary embodiment of a dual-band detector element 200 having a DRC microbolometer pixel (e.g., quarterwave cavity) design, and having a single opening 210 provided in the lead metal reflector 204 that underlies multiple grid openings 211 provided in the microbolometer membrane 208 (e.g., similar to the membrane grid of FIGS. 2-4). Single opening 210 provided in lead metal reflector 204 is shown in further detail in FIG. 8B. In the illustrated exemplary embodiment of FIGS. 8A and 8B, the detector components are configured so that visible spectrum radiation is transmitted through at least one of the membrane grid openings 211 and through the single opening 210 in the lead metal reflector 204 to underlying visible-imaging circuitry.

Figure 7A:
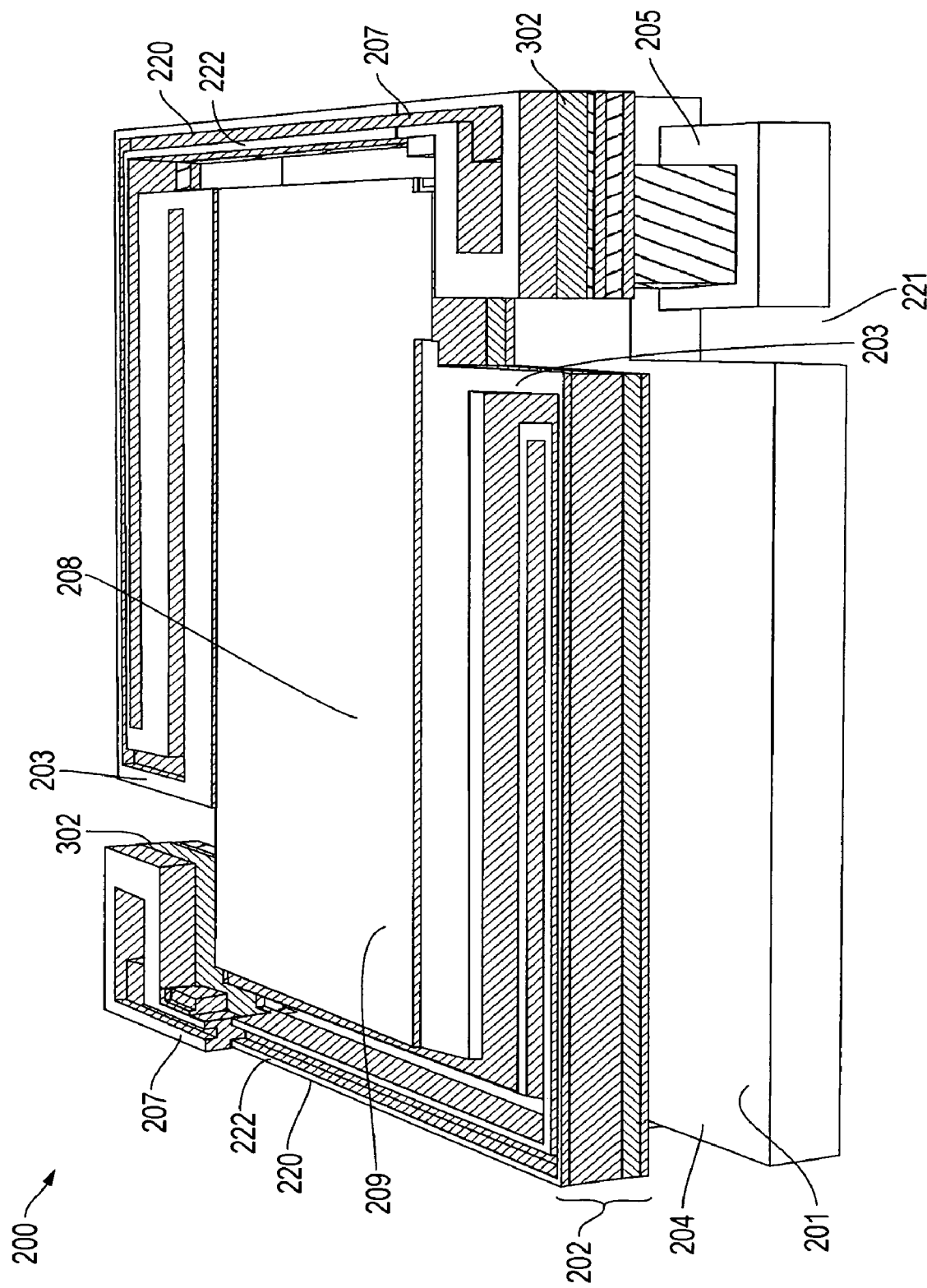
FIG. 7A is a perspective view of a multi-band detector element according to one embodiment of the disclosed systems and methods.
Figure 7B:
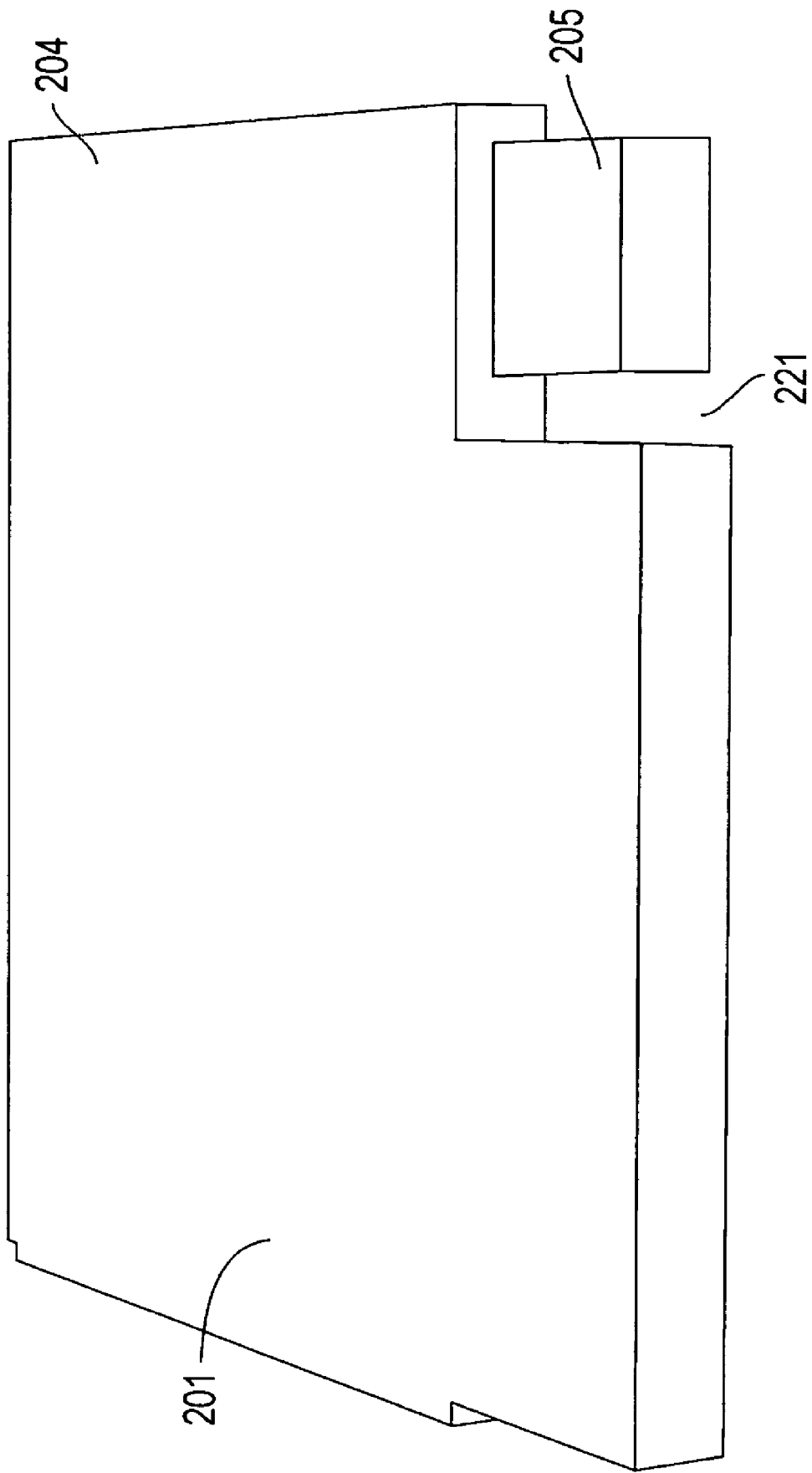
FIG. 7B is a perspective view of a lead metal reflector according to one embodiment of the disclosed systems and methods.

FIG. 7A illustrates another exemplary embodiment in which each of the thermal isolation legs 220 of an infrared detector element 200 may have an upper surface 222, the substantial entirety of which is substantially planar and oriented in substantially parallel relationship to the major plane of a corresponding suspended membrane 208 that has no openings defined therein, e.g., as in the case of a single-band infrared detector element. In one exemplary embodiment, each of the thermal isolation legs 220 of a single-band detector may be oriented in substantial parallel and substantially coplanar relationship to the substantially planar upper surface 209 of a corresponding suspended membrane 208 of the detector. As so configured, the upper surface 222 of a first end 203 of each thermal isolation leg 220 (i.e., end located proximal to the membrane 208 and attached or otherwise contiguous with the upper surface 209 of the membrane 208) may be configured to lie in the same plane as the upper surface 222 of the opposite second end 207 of the thermal isolation leg 220 (e.g., opposite end located distal to the membrane 208 and attached or otherwise contiguous with an interconnect 302 to underlying ROIC circuitry). As illustrated, such a substantially planar thermal isolation leg structure 220 may be advantageously configured for interconnection with underlying ROIC circuitry without stepping-down or ramping downward to the lead metal reflector and/or substrate underneath (e.g., by using a separate interconnect structure/s such as a TiW interconnect/SiN capping structure combination, or using a TiW interconnect structure alone, to couple the end of the substantially planar leg to the lead metal or substrate). In the practice of the disclosed systems and method, each of the legs 220 of a single-band DRC pixel 202 may additionally or alternatively be characterized as being oriented in substantially parallel relationship with a substantially planar upper surface 201 of a corresponding lead metal reflector.

The disclosed single-band and multi-band focal plane arrays and systems thereof may be fabricated using any methodology and/or materials (e.g., wafer-level packaging, single die-level packaging, etc.) that is suitable for providing a FPA and/or system having capabilities and characteristics as described elsewhere herein. For example, in one embodiment, a dual-band uncooled integrated infrared and visible CMOS imager FPA may be vacuum packaged, e.g., using wafer level vacuum packaging. Vacuum packaging may be employed in such an embodiment to achieve good thermal isolation for high sensitivity uncooled microbolometer array performance. Further information on vacuum packaging of focal plane arrays may be found in U.S. Pat. No. 6,586,831, U.S. Pat. No. 6,521,477, U.S. Pat. No. 6,479,320, United States Patent Publication number 2004/0219704, and U.S. patent application Ser. No. 11/141,356, each of which is incorporated herein by reference.

Figure 9:
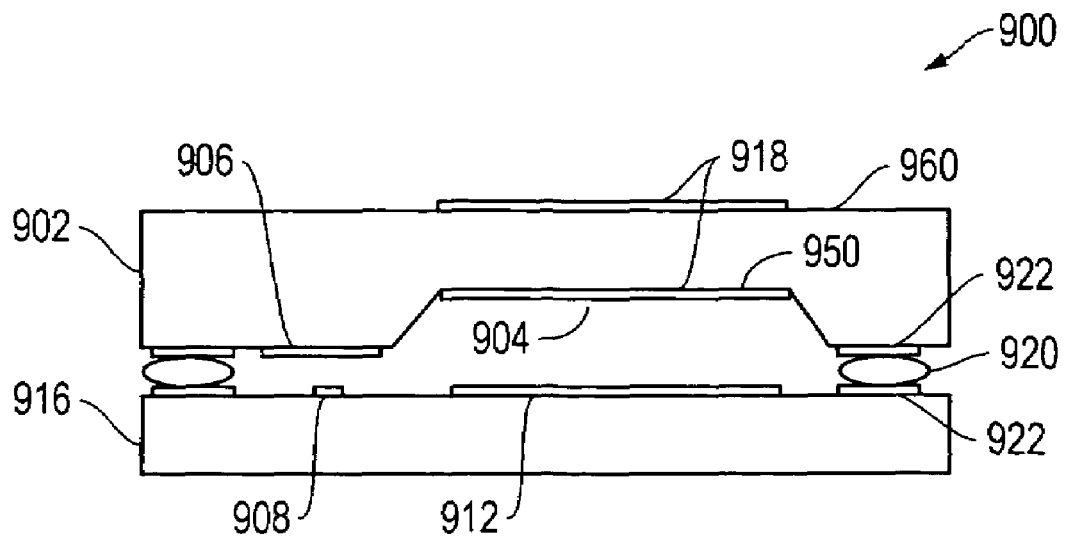
FIG. 9 is a simplified side cross-sectional view of a vacuum packaged focal plane array (FPA) assembly according to one embodiment of the disclosed systems and methods.
Figure 10:
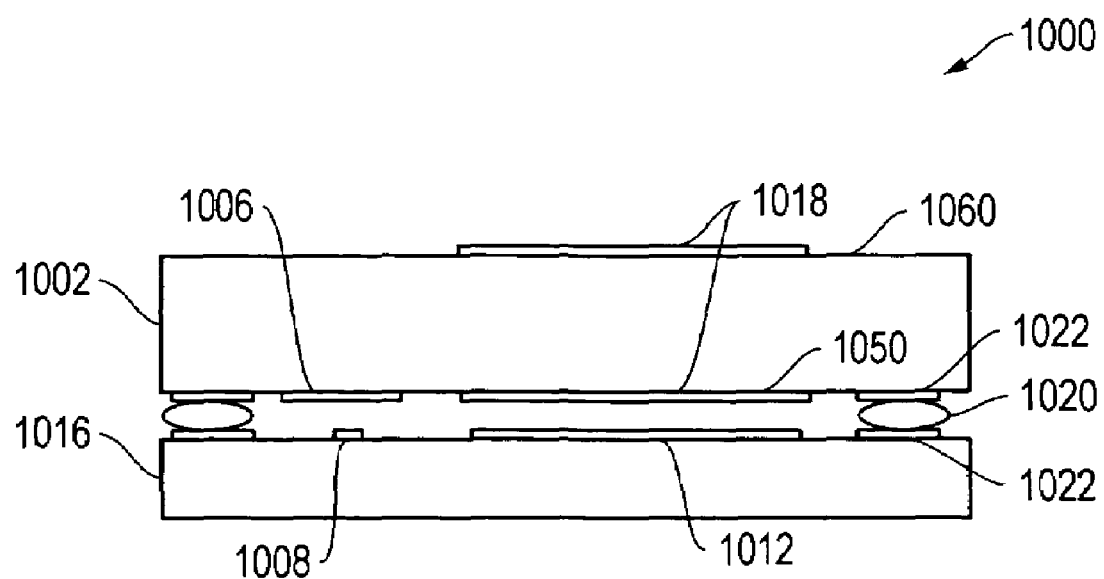
FIG. 10 is a simplified side cross-sectional view of a vacuum packaged focal plane array (FPA) assembly according to one embodiment of the disclosed systems and methods.

Two exemplary embodiments of a wafer-level packaged dual-band FPA are shown in FIGS. 9 and 10. FIG. 9 illustrates a cross sectional view of a wafer-level vacuum packaged dual-band (M×N) FPA 900 having a visible/infrared transparent lid 902 with an etched cavity 904, and FIG. 10 illustrates a cross sectional view of a wafer-level vacuum packaged dual-band (M×N) FPA 1000 having a planar visible/infrared transparent lid 1002 without etched cavity. Each of visible/infrared transparent lids 902 and 1002 may be materials such as ZnSe or other suitable material that is transmissive in both visible spectrum and infrared spectrum (e.g., sapphire materials, zinc sulfide materials, etc.). As shown in FIG. 9, a dual band FPA 912 is provided on a imager device wafer substrate 916 that may also include, for example, ROIC/CMOS 502 of FIG. 5. Similarly, FIG. 10 shows a dual band FPA 1012 disposed on a imager device wafer substrate 1016 that may include, for example ROIC/CMOS 502 of FIG. 5. Each of dual band FPA 912 and 1012 may be a M×N FPA with suspended thermally isolated infrared absorbing detector pixel elements. Antireflection surfaces 918 (e.g., visible/IR antireflection coatings) may be provided on inner and outer surfaces 950 and 960 of visible/infrared transparent lid 902 over FPA 912 as shown in FIG. 9. Similar antireflection surfaces 1018 may also be provided on inner and outer surfaces 1050 and 1060 of visible/infrared transparent lid 1002 over FPA 1012 as shown in FIG. 10.

FIG. 9 also shows infrared optically blocked reference pixel array 908 (i.e., array 908 of P×Q reference pixel elements) that is disposed on the substrate of wafer 916 as shown. An optically blocking structure in the form of a gold/platinum/titanium (Au/Pt/Ti) metallization blocking layer 906 is shown fabricated on the inner surface of the lid wafer element 902 directly over the reference row 108. A blocking layer may be so configured and positioned to at least partially or completely block infrared radiation from reaching reference pixel array 908. Similarly, FIG. 10 shows infrared optically blocked reference pixel array 1008 (i.e., array 1008 of P×Q reference pixel elements) that is disposed on the substrate of wafer 1016 as shown. An optically blocking structure in the form of a gold/platinum/titanium (Au/Pt/Ti) metallization blocking layer 1006 is shown fabricated on the inner surface of the lid wafer element 1002 directly over the reference row 1008 to at least partially or completely block infrared radiation from reaching reference pixel array 1008. Further information on optically blocked reference pixel arrays may be found in U.S. patent application Ser. No. 11/141,361, which is incorporated herein by reference.

As further shown in FIG. 9, a gold-tin (AuSn) solder seal 920 is shown disposed between gold-platinum-titanium metallization layers 922 provided on each of the bond surfaces of lid 902 and FPA/ROIC device wafer substrate 916, i.e., as a peripheral seal around FPA 912 and reference array 908. Similarly, in FIG. 10, a gold-tin (AuSn) solder seal 1020 is shown disposed between gold-platinum-titanium metallization layers 1022 provided on each of the bond surfaces of lid 1002 and FPA/ROIC device wafer substrate 1016, i.e., as a peripheral seal around FPA 1012 and reference array 1008. Further information on such vacuum-packaging methodology may be found in U.S. patent application Ser. No. 11/141,356, which is incorporated herein by reference. However, any other suitable methodology for forming a vacuum tight peripheral seal around FPA 912 or 1012 and respective reference array 908 or 1008 may be employed, e.g., such as lid and device sealing rings and heat activated solder layer and non-heat activated sealing layers described in U.S. Pat. Nos. 6,586,831, 6,521,477 and 6,479,320, each of which are incorporated herein by reference.

It will be understood that a multi-band (e.g., dual-band) FPA may alternatively be packaged at the single die-level, e.g., using ceramic package with optical window of ZnSe or other suitable material that is transmissive in both visible spectrum and infrared spectrum (e.g., sapphire materials, zinc sulfide materials, etc.). It is further understood that the window materials may be coated with anti-reflection coatings designed for each material, which simultaneously enhance the transmission in all the spectral bands of interest, e.g., visible, near IR, midwave IR, and long wave IR.

In one embodiment of the disclosed systems and methods, two wafer materials, in the form of a first segmented wafer and a second unsegmented wafer having different TCEs, may be bonded together, with or without the presence of a vacuum in the final package. In this embodiment, a first one of the wafers may be first segmented (e.g., reticulated and diced up) into multiple portions (e.g., individual die-sized parts) so that difference in material expansion characteristics due to the difference in TCEs between the two different wafer materials of the first and second wafers is limited to the relatively smaller dimensions of each portion of the segmented wafer (e.g., limited to each die) rather than to the relatively larger dimensions of the original unsegmented first wafer.

Once segmented, the individual portions (e.g., segmented window lid components) of the segmented first wafer may be held in relative alignment with corresponding components (e.g., individual device die) on the unsegmented second wafer so that mating surfaces of all of the segmented first wafer portions may be bonded simultaneously to corresponding mating surfaces of the unsegmented second wafer. Individual portions of the segmented first wafer may held in alignment with corresponding components of the unsegmented second wafer in any suitable manner, e.g., by using spacer structures such as a grid of spacer wires or thin spacer walls that form compartments for retaining the segmented portions, by temporarily adhering a non-mating surface of the segmented portions of the first wafer to a substantially planar surface so that the mating surface of the segmented portions are held in position for simultaneously mating with the mating surface of the unsegmented components of the second wafer, etc.

Using the disclosed systems and methods, many types of non-silicon-based materials (e.g., materials that are optically transmissive in the visible spectrum) may be bonded to silicon-based materials (e.g., a silicon wafer), with or without the presence of a vacuum in the final package. Specific examples of MEMS devices that may be packaged in this embodiment include, but are not limited to, optical devices such as single-band or multi-band detector FPAs, reflective displays such as digital micromirror device (DMD) elements of a digital light processing (DLP) system, resonant reflective devices for choppers & scanners, optical input/output (I/O) devices, devices for optical communication, etc. Specific examples of FPA devices include, but are not limited to, single-band or multi-band integrated FPAs (e.g., single band visible FPA devices, or integrated dual-band FPA devices that are capable of detecting both near IR spectrum radiation and visible spectrum radiation), and optically sensitive cantilever devices. Examples of non-silicon-based materials that are optically transmissive in both the visible spectrum and the IR spectrum include, but are not limited to, zinc selenide materials, sapphire materials, zinc sulfide materials, etc. Such materials may be employed in the practice of the disclosed systems and methods as lid wafer materials for packaging or vacuum-packaging multi-band integrated FPA devices that are capable of detecting both IR spectrum radiation and visible spectrum radiation.

Figure 11:
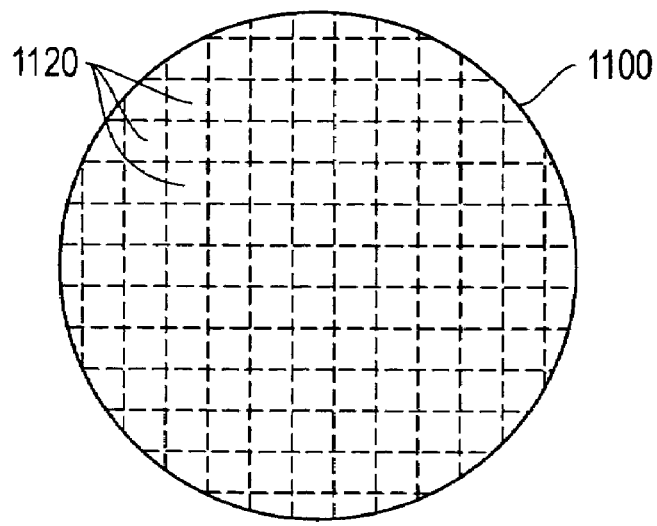
FIG. 11 shows a lid wafer according to one embodiment of the disclosed systems and methods.

FIG. 11 shows a lid wafer 1100 as it may be patterned (e.g., with solder base metal) and then segmented (e.g., reticulated and diced-up) according to one exemplary embodiment as indicated by dashed lines in FIG. 11 to form individual window lid components 1120. In this regard, the mating surface of the individual window lid components of the segmented first wafer may be patterned with a solder base metal seal ring and solder (e.g., perform or deposited or plated solder) such as shown in FIGS. 9 and 10, segmented, and then placed into compartments of a tooling plate 1200 of FIG. 12 in a manner as described further herein.

In the exemplary embodiment of FIG. 11, lid wafer 1100 may be a non-silicon-based material (e.g., zinc selenide material, sapphire material, zinc sulfide material, etc.) that is optically transmissive in both the visible spectrum and the IR spectrum, or may be any other type of wafer material (optically transmissive or non-optically transmissive) that is suitable for segmentation into individual components that are to be bonded to a separate wafer, e.g., a wafer of material that is dissimilar to window lid components 1120, and that has a TCE that is substantially different from the TCE of the material of window lid components 1120. In one embodiment, window lid components 1120 may be each configured in the form of visible/infrared transparent lids such as illustrated in FIGS. 9 (with etched cavity) and FIG. 10 (planar).

Figure 12:
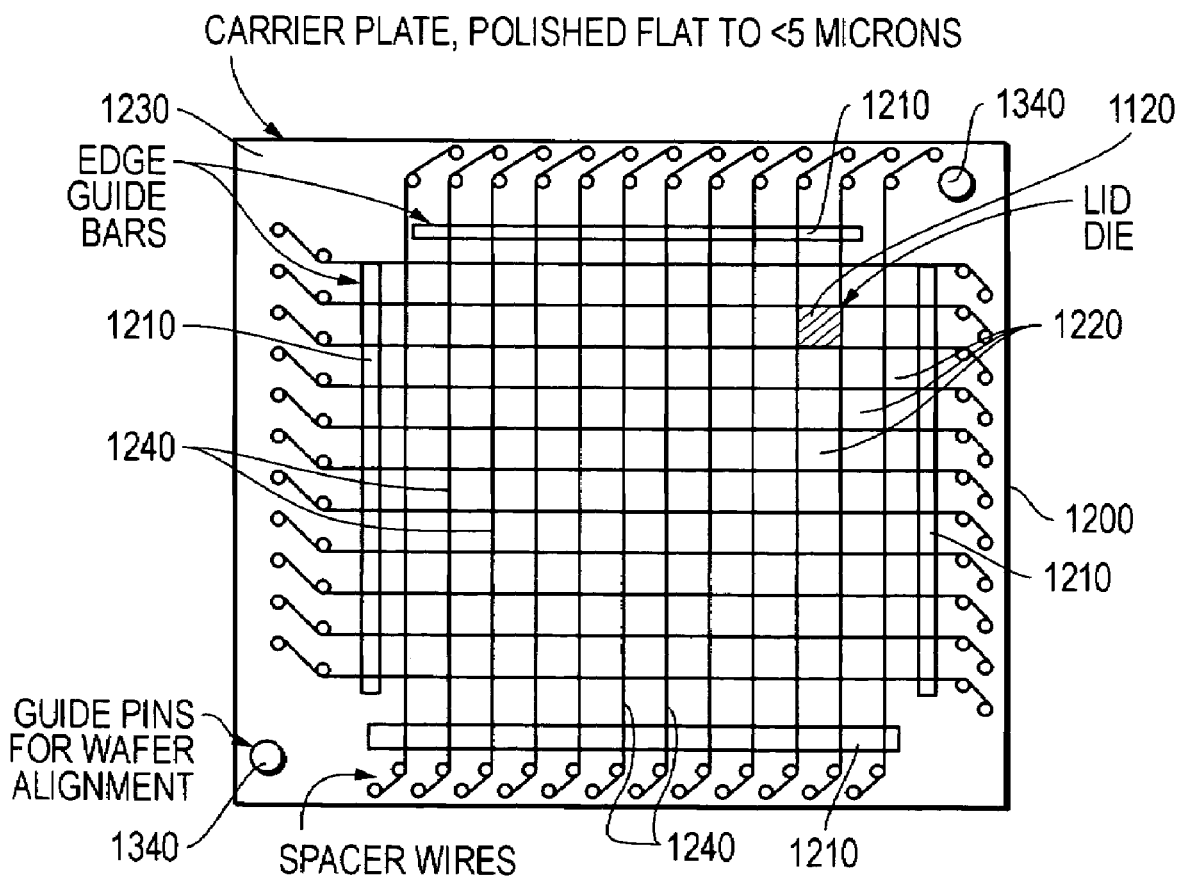
FIG. 12 shows a tooling plate according to one embodiment of the disclosed systems and methods.

FIG. 12 shows a lid component tooling plate 1200 as it may be configured and employed in one exemplary embodiment to hold individual segmented window lid components 1120 of FIG. 11 in place in alignment for simultaneous mating with individual device die of a device wafer. As shown, tooling plate 1200 includes a plurality of spacer structures 1240 configured as a grid on tooling plate substrate 1230 (e.g., a carrier substrate polished flat to less than about 5 microns or other suitable substrate) of tooling plate 1200. In the illustrated embodiment, spacers 1240 include a plurality of spacer wires having opposite ends that are secured around the periphery of substrate 1230 at right angles so as to form a grid of individual compartments 1220 dimensioned to be suitable for containing individual segmented window lid components of lid wafer 1100 as shown. When spacer structures are so employed for containing segmented components, dimensions of the window lid components may be fabricated to be complementary (e.g., to accept or allow for) the outer dimensions of the spacer structures (e.g., outer diameter of the spacer wires). This may be done, for example, by fabricating the window lid components 1120 such that the width of each component 1120 plus the diameter of spacer wire 1240 is equal to the center-to-center distance of device die 1320 (see FIG. 13) in both x and y dimensions. In one exemplary embodiment, diameter of spacer wire 1240 may be from about 4 to about 10 mils, although greater or lesser diameters are possible. Also shown in FIG. 12 are optional edge guide bars 1210 that may be provided in this embodiment for the purpose of ensuring parallelism of spacer wires 240. Edge guide bars 1210 are optional and may or may not be used.

In one embodiment of the disclosed systems and methods, each of tooling plate 1300, tooling plate 1200, spacer structures 1240 and optional edge guide bars 1210 may be manufactured of the same material (e.g., inconel, graphite, molybdenum, stainless steel, etc.), or may be otherwise manufactured of materials having similar thermal expansion characteristics.

Figure 13:
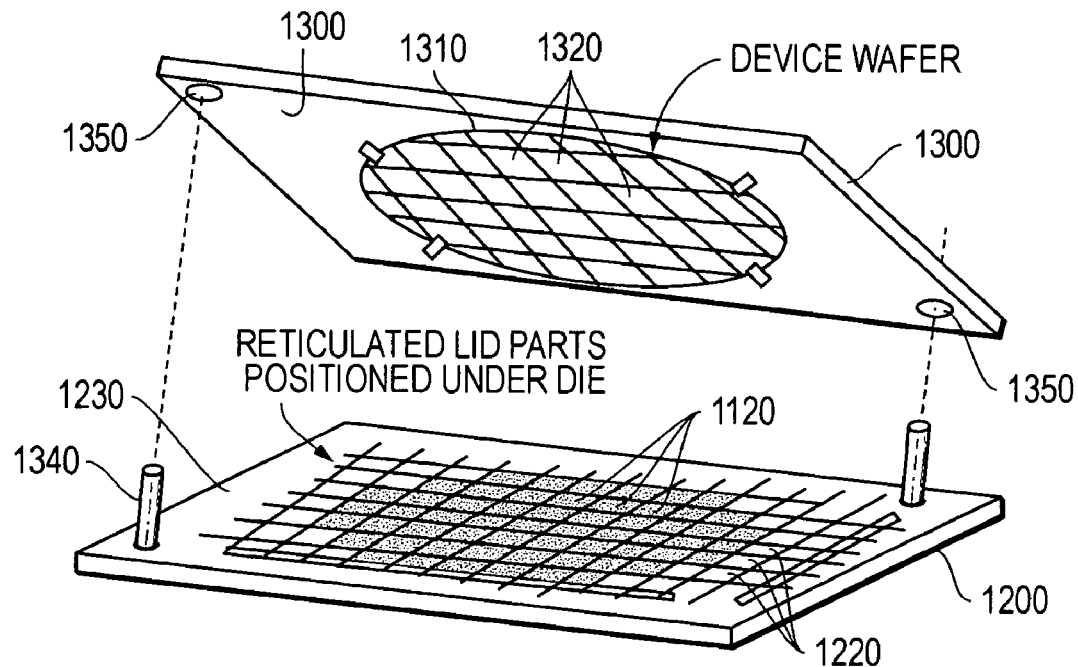
FIG. 13 is a perspective view of a wafer carrier and tooling plate according to one embodiment of the disclosed systems and methods.

As shown in FIG. 13, individual window lid components 1120 are held in place within compartments 1220 of tooling plate 1200. The number of window lid components 1120 may be of equal or different number (e.g., greater or lesser number) than the number of device die 1320. Lid component tooling plate 1200, in turn, is positioned adjacent device tooling plate (e.g., wafer carrier, device wafer carrier, ROIC wafer carrier) 1300 that holds or retains device wafer 1310 thereon. Wafer alignment guide structures are shown provided in this exemplary embodiment in the form of guide pins 1340 that extend upwardly from tooling plate 1200, and that are configured to be received in guide pin openings 1350 defined within tooling plate 1300 as shown. In this exemplary embodiment, guide pins 1340 and guide pin openings 1350 are positioned so that individual window lid components 1120 are in alignment with individual device die 1320 of device wafer 1310 when guide pins 1340 are received within guide pin openings 1350 in tooling plate 1200. Once so aligned, individual window lid components 1120 are in alignment with respective individual device die 1320 to which they are to be bonded, and tooling plate 1200 may be brought together with wafer carrier 1200 to simultaneously assemble all of window lid components 1120 to device dice 1320. In one embodiment, tooling plate 1200 holding individual (e.g., segmented) window lid components 1120 may be oriented to be on the lowermost tooling plate (underneath device tooling plate 1300) so that force of gravity acts to hold the individual components within their respective compartments 1220.

Figure 14:
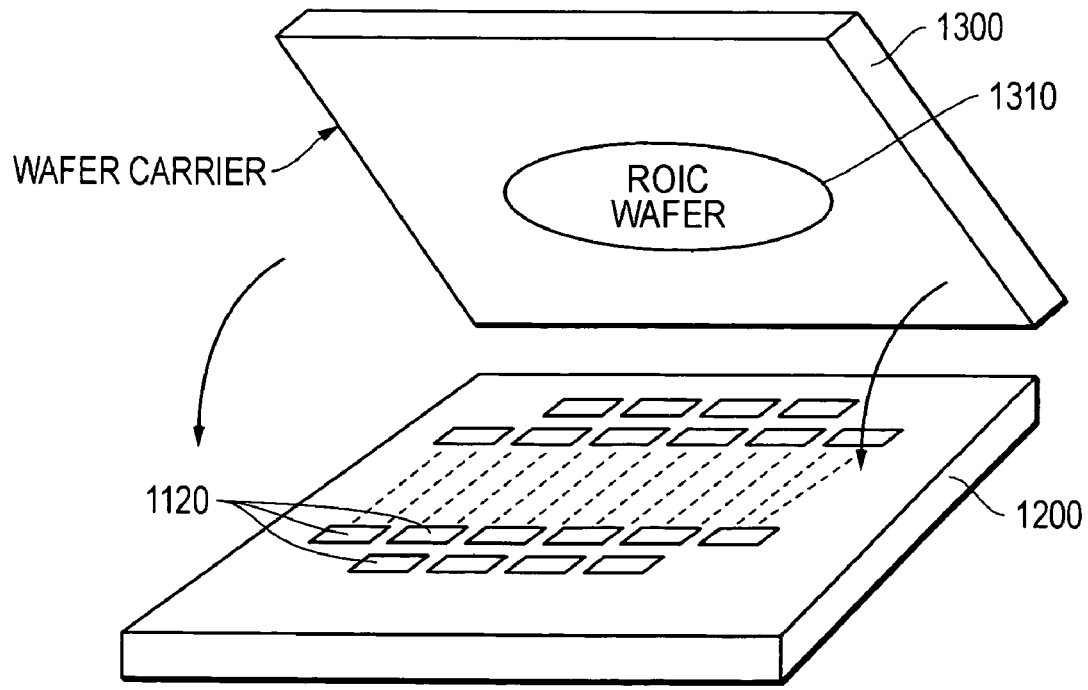
FIG. 14 is a perspective view of a wafer carrier and tooling plate according to one embodiment of the disclosed systems and methods.

After tooling plate 1200 is brought together with tooling plate 1300 as shown by arrows in FIG. 14, individual window lid components 1120 may be bonded to respective individual device die 1320, e.g., sealed and optionally vacuum packaged using any suitable methodology. Bonding may be performed using, for example, a suitable solder such as described elsewhere herein, or alternatively may be performed using any other type of suitable bonding material. For example, where thermal expansion coefficients of device die and window lid component materials are sufficiently similar (e.g., Pyrex glass window lid component bonded to silicon device die) such materials may be bonded anodically. In another embodiment bonding may be performed using organic materials such as epoxy where hermeticity requirements are relaxed, etc.). Advantageously, since individual window lid components have been segmented from lid wafer 1100, the effect of any difference in thermal expansion between lid wafer material and device wafer material for a given individual component is limited to the relatively small window lid component dimensions rather than the relatively large lid wafer dimensions. After bonding, device wafer 1310 now has an array of segmented window lid components 1120 covering all die sites 1320 in this embodiment, although it is also possible in another embodiment that only a portion of die sites 1320 may be covered. Device wafer 1310 may then be segmented (e.g., sawed) into individual completed die such as shown in FIGS. 9 and 10.

When soldering is employed to bond individual window lid components 1120 to respective individual device die 1320 of device wafer 1310, any heating and assembly methodology may be employed that is suitable for bonding individual window lid components 1120 to respective individual device die 1320 using solder. For example, device wafer 1310 and individual window lid components 1120 with solder may be heated prior to bringing tooling plate 1200 together with wafer carrier 1200 to accomplish bonding of window lid components 1120 to device dice 1320. Alternatively, tooling plate 1200 and wafer carrier 1200 may be brought together first, followed by heating of device wafer 1310 and individual window lid components 1120 to accomplish bonding of window lid components 1120 to device dice 1320. Although solder may be patterned, deposited or otherwise placed on individual lid components and/or device die in any suitable manner for bonding, in one embodiment solder may be placed on lid component/s or device die that are contained on the lowermost tooling plate (oriented underneath the other tooling plate) so as to take advantage of gravity effects.

In another embodiment of the disclosed systems and methods, it is possible that not all compartments 1220 of tooling plate 1200 are filled with window lid components 1120 (i.e., so that some of compartments 1220 remain empty) prior to bringing tooling plate 1200 together with wafer carrier 1200 so as to accomplish bonding of window lid components 1120 to only a portion of device dice 1320 of device wafer 1310. Such an embodiment may be desirable, for example, to conserve window lid components in a case where some device die 1320 are defective and it is therefore not desired to package all die 1320 of wafer 1310.

In another embodiment of the disclosed systems and methods, it is possible that not all compartments 1220 of tooling plate 1200 are filled with the same type of components for assembly and bonding to device dice 1320 of tooling plate 1200. For example, a first portion of the compartments 1220 of tooling plate 1200 may be filled with window lid components 1120 of one type of material (e.g., zinc selenide material), and a second portion of the compartments of 1220 of tooling plate 1200 may be filled with window lid components 1120 of another different type of material (e.g., sapphire material) so as to accomplish simultaneous bonding of two different types of window lid components 1120 to device dice 1320 of device wafer 1310. Similarly, it is also possible that three or more different types of window lid components 1120 may be placed in three or more corresponding portions of the compartments of 1220 of tooling plate 1200 so as to accomplish simultaneous bonding of three or more different types of window lid components 1120 to device dice 1320 of device wafer 1310.

Besides different types of window lid components 1120, it is also possible that a portion of compartments of 1220 of tooling plate 1200 may be filled with a first type of components (e.g., window lid components 1120), while one or more other portions of compartments 1220 are filled with one or more other different types of components (e.g., one or more types of non-window lid components) so as to accomplish simultaneous bonding of the first type of components and one or more other types of components to device dice 1320 of device wafer 1310.

Figure 15:
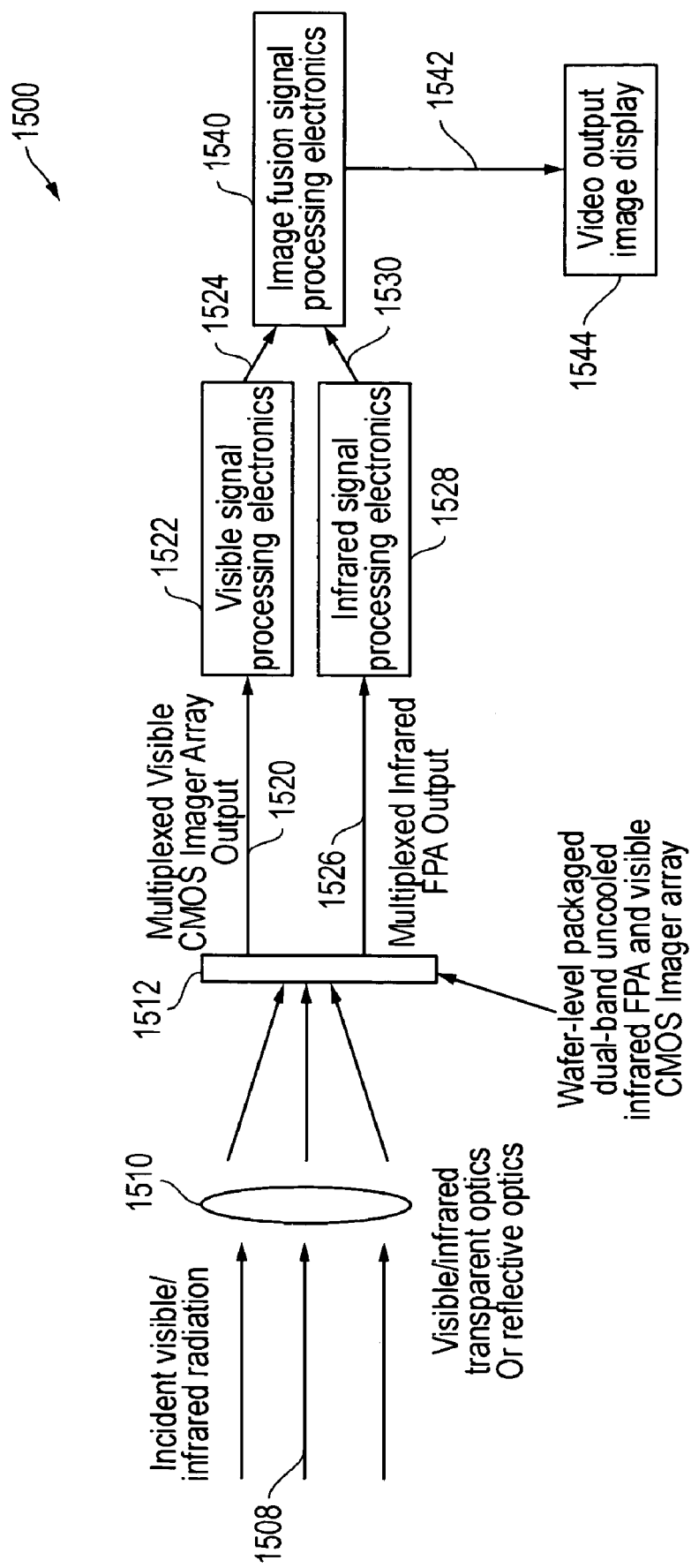
FIG. 15 is a block diagram of a dual-band infrared/visible imaging system according to one embodiment of the disclosed systems and methods.

FIGS. 15 through 17 show block diagrams of three embodiments of dual-band visible/infrared imaging systems as they may be provided using the disclosed systems and methods. In the illustrated embodiments, visible and infrared radiation 1508 radiating from the scene is incident on visible/ infrared-transmitting optics 1510, for example, zinc selenide (ZnSe) optics. However, reflective optics may be alternatively employed. As shown in each of FIGS. 15-17, the visible and infrared radiation is focused by the optics 1510 onto a dual-band infrared FPA/CMOS Imager 1512 (e.g., wafer level packaged dual-band uncooled infrared FPA and visible CMOS imager array), which is provided in each of the illustrated embodiments as a wafer-leveled packaged dual-band uncooled integrated infrared FPA and visible CMOS imager array.

As shown in the embodiment of FIGS. 15-17, dual-band infrared FPA/CMOS Imager 1512 provides a multiplexed visible CMOS imager array output 1520 to visible spectrum signal processing electronics 1522 which, in turn, provides a processed visible image signal 1524 to image fusion signal processing electronics 1540. Likewise, dual-band infrared FPA/CMOS Imager 1512 provides a multiplexed infrared FPA output 1526 to infrared spectrum signal processing electronics 1528 which, in turn, provides a processed infrared image signal 1530 to image fusion signal processing electronics 1540. Image fusion signal processing electronics 1540 produces a fused infrared/visible image signal 1542 that in this case is provided to video output display 1544. Further information regarding image fusion signal processing is described herein in relation to FIG. 18.

In the exemplary embodiment of FIG. 15, a dual-band infrared/visible imaging system 1500 is illustrated without having a chopper or shutter in the optical train between the source of radiation and the dual-band infrared FPA/CMOS Imager 1512. However, as shown in the exemplary embodiments of FIGS. 16 and 17, a shutter and/or chopper may be provided to at least partially correct drift in infrared FPA offsets. As shown, such a shutter and/or chopper may be placed in the optical train between a source of radiation 1508 and a dual-band infrared FPA/CMOS Imager 1512 and, in the illustrated examples, is shown placed between optics 1510 and dual-band infrared FPA/CMOS Imager 1512.

In the embodiment illustrated in FIG. 16A, a dual-band infrared/visible imaging system 1600 may be provided having an opaque aperiodic shutter 1602 placed in front of the dual-band infrared FPA/CMOS Imager 1512 in the optical train between a source of radiation 1508 and the dual-band infrared FPA/CMOS Imager 1512 to calibrate out any spatial pattern noise in the multiplexed infrared FPA output 1526 which may be induced by either temperature drift or 1/f noise. The shutter is inserted as needed into the optical train to block the incident radiation and to provide an isothermal surface with which the output of the dual-band infrared FPA/CMOS Imager 1512 may be recalibrated. FIG. 16B is a simplified side view of aperiodic shutter 1602, in this exemplary embodiment provided with a mast 1604 that is mechanically coupled to at least partially rotate around a point 1606 so that shutter 1602 may be selectably inserted and removed from the optical train in the direction of the double-headed arrows.

Figure 17A:
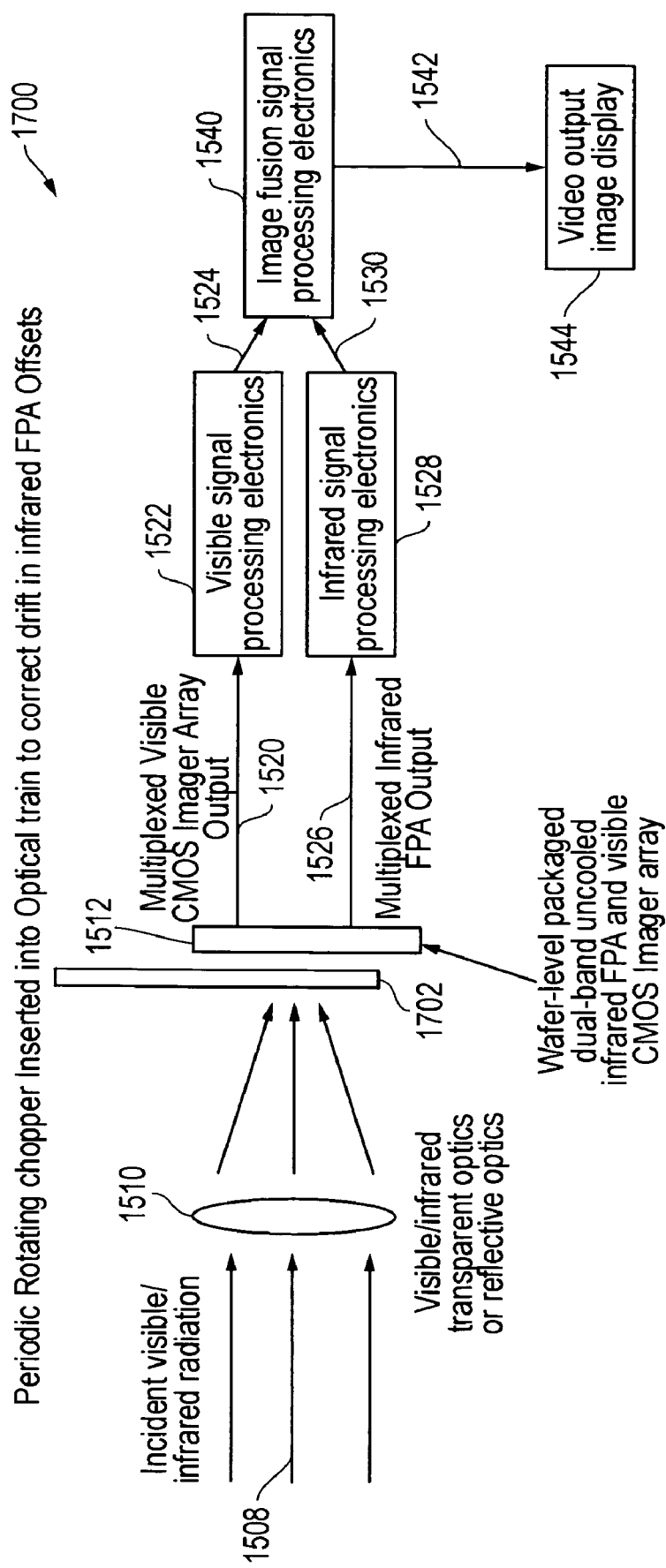
FIG. 17A is a block diagram of a dual-band infrared/visible imaging system according to one embodiment of the disclosed systems and methods.

In the embodiment illustrated in FIG. 17A, a dual-band infrared/visible imaging system 1700 may be provided having a periodic rotating chopper 1702 (opaque or diffusing periodic chopper) may be placed in front of the dual-band infrared FPA/CMOS Imager 1512 in the optical train between a source of radiation 1508 and the dual-band infrared FPA/ CMOS Imager 1512 to calibrate out any fixed pattern noise in the multiplexed infrared FPA output 1526 every frame. For example, if the imager 1512 is running at a 30 Hz frame rate, then the chopper 1702 may be configured to rotate to block (i.e., in the case of an opaque chopper) or diffuse (i.e., in the case of a difflusing chopper) the incident radiation every frame for half of the frame time. The output from the blocked or diffused half frame is subtracted from the output from the "open" half frame thereby removing any temperature drift-induced or 1/f noise induced spatial pattern noise in the multiplexed infrared FPA output 1526.

Figure 17C:
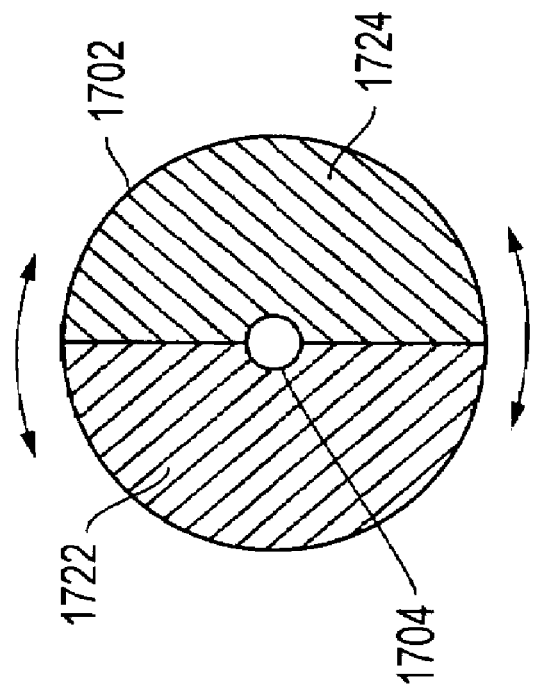
FIG. 17C is a simplified side view of a periodic chopper according to one embodiment of the disclosed systems and methods.
Figure 17B:
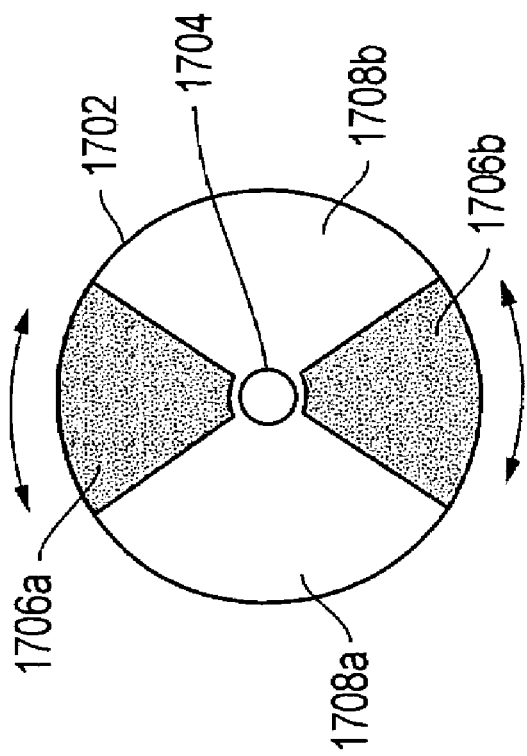
FIG. 17B is a simplified side view of a periodic chopper according to one embodiment of the disclosed systems and methods.

FIG. 17B is a simplified side view of periodic rotating chopper 1702 that is configure to rotate around a center point 1704 in either clockwise or counter clockwise direction so that chopper blades 1706a and 1706b are each periodically inserted and removed from the optical train. In such an embodiment, chopper portions 1708a and 1708b may each be "open" to pass incident radiation. As shown in FIG. 17B, chopper portions 1708a and 1708b may be disposed between blades 1706a and 1706b, each of which may each be opaque or diffusing in a manner as described above. Further information on choppers may be found in U.S. Pat. No. 4,143,269; U.S. Pat. No. 5,021,663; U.S. Pat. No. 5,051,591; U.S. Pat. No. 5,952,661; U.S. Pat. No. 5,965,890; U.S. Pat. No. 6,034, 371; U.S. Pat. No. 6,232,044; U.S. Pat. No. 6,437,332; and U.S. Pat. No. 7,102,832, each of the foregoing United States patents being incorporated herein by reference.

It will be understood that provision of an aperiodic shutter and/or periodic chopper is optional, and that in one embodiment no aperiodic shutter and/or no periodic chopper may be positioned between a source of radiation and a FPA, e.g., as shown in FIG. 15.

Figure 18:
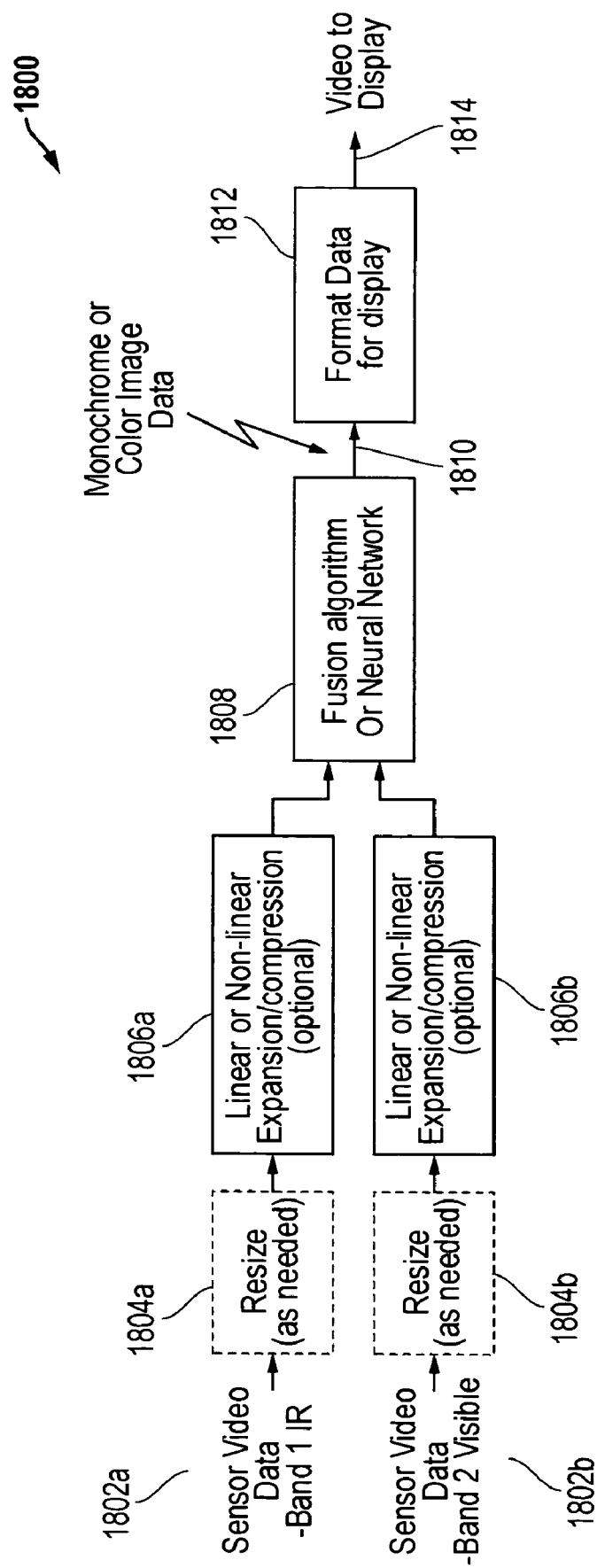
FIG. 18 is a block diagram of dual-band sensor image fusion video processing according to one embodiment of the disclosed systems and methods.

FIG. 18 is a block diagram illustrating dual-band sensor image fusion video processing 1800 as it may be implemented using one embodiment of the disclosed systems and methods. In this embodiment, sensor data 1802 for each band (IR band 1802a and visible band 1802b) is received and if the resolution of the images is different, then the resolution may be matched in block 1804 by resizing the lower resolution image as needed to match the higher resolution image. However, since some fusion algorithms provide for differences in spatial resolution this resizing may not be necessary. Images may then be optionally expanded or compressed in dynamic range to better match the dynamic range requirements of the fusion algorithm/s of block 1808. This image expansion/ compression of block 1806 may be, for example, a linear or a non-linear transform. Image fusion of visible and IR images may be accomplished in block 1808 using any algorithm suitable for fusing multiple (e.g., two) images. Examples of such image fusion algorithms include, but are not limited to, image fusion algorithms ranging from simple addition to complicated mathematical algorithms or neural networks. Specific examples of fusion algorithms suitable for the fusion of infrared and visible spectrums include, but are not limited to, multiscale decomposition-based algorithms such as Laplacian (LAP) pyramid, shift invariant discrete wavelet transform (SiDWT) and the filter-subtract-decimate (FSD) pyramid. Exemplary fusion algorithms may result in monochrome or color representations of the fused image as image data 1810, although other representations are possible. The data is then formatted for display in block 1812 and output as video data 1814 for display.

In one embodiment of the disclosed systems and methods, a multi-band detector for a multi-band integrated FPA may be provided with color imaging capability in the UV-VISIBLE spectral band. In such an embodiment, color imaging may be obtained by providing a color filter over each pixel of the Visible detector array in a path of visible spectrum radiation between said one or more openings in an infrared detector membrane and each pixel element. Such color filter arrays may be provided, for example, by deposition of interference multilayer coatings designed to transmit in the Red, Green, or Blue spectral bands, or any other band of interest. One example of such a multilayer coating configuration includes alternating layers of silicon dioxide or silicon nitride (low index of refraction) and amorphous silicon (high index of refraction), although any other coating configuration suitable for providing a color filter array may be employed. In such an embodiment, visible array pixels and associated color filters may be placed under a opening of the microbolometer pixels, so that one or more visible response pixels may be housed under each infrared pixel.

In another embodiment, a multi-band FPA may be provided with color correction within the infrared spectrum. Color correction may be useful or needed for a multi-band FPA system where optical elements (e.g., lenses, mirrors, etc.) focus energy (e.g., visible spectrum energy, infrared spectrum energy) at different locations depending upon the wavelength of the energy. This focusing difference may be compensated for (i.e., so as to focus both IR energy and visible energy on the same focal plane) in optical elements of a multi-band FPA system using color correction provided by one or more optical elements.

In one exemplary embodiment, a color-correcting chopper may be employed to provide color correction to a multi-band FPA system. In such an embodiment, a multi-focusing color-correcting optical chopper may be placed in the optical train of a FPA system (e.g., in a manner such as illustrated for optical chopper 1702 in FIG. 17A). As shown in FIG. 17C, such a color-correcting chopper may be configured, for example, so that a first portion (e.g., one half) 1722 of the chopper 1702 focuses IR energy on the focal plane of the FPA, while a second portion (e.g., other half) 1724 of the chopper 1702 focuses visible energy on the focal plane of the FPA.

A color-correcting chopper may be similarly configured for other multi-band FPA configurations, e.g., a combination of mid-wave IR (about 3 to about 5 microns) and long-wave IR (about 8 to about 12 microns) detection capability that is integrated into a single dual-band FPA; a combination of short-wave IR (about 1 to about 3 microns) and long-wave IR (about 8 to about 12 microns) detection capability that is integrated into a single dual-band FPA; a combination of short-wave IR (about 1 to about 3 microns) and mid-wave IR (about 3 to about 5 microns) detection capability that is integrated into a single dual-band FPA; combination of short-wave IR (about 1 to about 3 microns), mid-wave IR (about 3 to about 5 microns), and long-wave IR (about 8 to about 12 microns) detection capability that is integrated into a single tri-band FPA; combination of short-wave IR (about 1 to about 3 microns), mid-wave IR (about 3 to about 5 microns), long-wave IR (about 8 to about 12 microns); and visible wavelength detection capability that is integrated into a single quad-band FPA; etc.

For example, still referring to FIG. 17C, in a case where optical components are configured to focus visible energy (but not IR energy) on the focal plane of a dual-band FPA, a first portion 1722 of the color-correcting chopper 1702 may be clear, transparent or otherwise "open" with no material contained therein to allow all energy (including visible energy focused on the focal plane of the FPA) to pass through to the FPA. A second portion 1724 of the same chopper 1702 may be configured to be opaque to visible energy while at the same time correcting the optical path to focus IR energy on the focal plane of the FPA. Such a configuration may be achieved, for example, by using a micro-lens/es or lenslets formed from silicon. In such a configuration, when the first portion 1722 of the chopper is aligned within the optical path of the FPA so that the FPA is viewing the clear or "open" first portion 1722 of the chopper, the visible energy is in focus on the focal plane of the FPA and the IR energy is defocused (diffused). When the second portion 1724 of the chopper is aligned within the optical path of the FPA so that the FPA is viewing the second portion 1724 of the chopper, the visible energy is blocked and the IR energy is in focus on the focal plane of the FPA. Such a configuration may be implemented to provide the visible components of the FPA with a focused visible image and a visibly blank reference, and it provides the IR components of the FPA with a focused IR image and an IR diffused image. In this and similar embodiments employing choppers with multi-portion configurations, a first radiation spectrum (e.g., visible spectrum) and a second radiation spectrum (e.g., IR spectrum) may be read out (e.g., alternately read out) from the corresponding components of the FPA (e.g., the corresponding visible and IR components of the FPA) in synchronization and in-phase with positioning of the respective first and second portions of the chopper in alignment with the optical path of the FPA.

In another exemplary embodiment, first portion 1722 of the color-correcting chopper 1702 may be manufactured of silicon-based material to block visible and near IR energy, while at the same time, passing other IR energy. In such an embodiment, a second portion 1724 of the same chopper 1702 may be manufactured of glass to pass visible and near IR energy, while at the same time blocking other IR energy.

In yet another exemplary embodiment, first portion 1722 of the color-correcting chopper 1702 may be additionally or alternatively provided as a material of different thickness as a second portion 1724 of the same chopper 1702 so as to focus particular energy wavelengths as different points relative to a FPA, and/or to selectively pass energy of different wavelengths. In yet another exemplary embodiment, a color-correcting chopper 1702 may be provided having at least two portions of different thickness that act to focus energy of two different wavelengths received from an optical train onto the focal plane of a multi-band FPA. For example, a first portion (e.g., one half) 1722 of such a chopper 1702 may be configured with an IR-transmissive material of suitable thickness to focus IR energy of a first IR wavelength on the focal plane of the FPA, while a second portion (e.g., other half) 1724 of the same chopper 1702 may be configured with an IR-transmissive material of suitable thickness to focus IR energy of a second IR wavelength on the focal plane of the FPA. To illustrate, a dual-band FPA may be provided that has detection capability for both short-wave IR energy (about 1 to about 3 microns) and long-wave IR energy (about 8 to about 12 microns), and having optical train components that without correction do not focus either short-wave IR energy or long-wave IR energy on the focal plane of the dual-band FPA. In such a case, a first portion 1722 of a color-correcting chopper 1702 present between the optical components and the dual-band FPA may be an IR-transmissive material (e.g., a silicon-based material) of a first thickness that acts to focus short-wave IR energy received from the optical components on to the focal plane of the dual-band FPA, and a second portion 1724 of the same color-correcting chopper may be an IR-transmissive material (e.g., a silicon-based material) of a second thickness that acts to focus long-wave IR energy received from the optical components on to the focal plane of the dual-band FPA to allow all energy (including visible energy focused on the focal plane of the FPA) to pass through to the FPA.

It will thus be understood that a color-correcting chopper may be provided having a plurality (e.g., two or more, three or more, four or more, etc.) of different portions configured for focusing energy of a corresponding plurality of different energy wavelengths received from an optical train onto the focal plane of a multi-band FPA configured with detection capability for the corresponding plurality of different energy wavelengths. Moreover, different portions of the color-correcting chopper may be configured in any manner suitable for focusing a respective energy wavelength on to the focal plane of a multi-band FPA. In this regard, a given energy transmissive portion of a color-correcting chopper may differ from other energy-transmissive portions of the color-correcting chopper by virtue of the absence or presence of a selected energy-transmissive material, the type/s or combination of type/s of selected energy-transmissive material, the thickness of energy-transmissive material, etc. Furthermore, it will be understood that color-correcting chopper may alternatively have a plurality (e.g., two or more, three or more, four or more, etc.) of different portions configured for focusing energy of a corresponding plurality of different energy wavelengths received from an optical train onto multiple (e.g., non-integrated) detectors configured with detection capability for the corresponding plurality of different energy wavelengths.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A wafer-level packaged focal plane array assembly, comprising:
    a device wafer, said device wafer comprising a multi-band focal plane array; and
    a lid wafer, said lid wafer being at least partially transparent to visible and infrared radiation and being assembled to said device wafer so that said lid wafer allows visible radiation to reach said multi-band focal plane array through said lid wafer;
    wherein said multi-band focal plane array comprises a plurality of detector elements, each of said detector elements comprising:
        a substrate,
        read out integrated circuitry (ROIC) disposed on said substrate, said ROIC including visible imaging circuitry configured to detect visible radiation, and
        an infrared radiation detector structure configured to absorb infrared radiation, said infrared detector structure comprising a membrane supported at a position spaced above said substrate, said membrane having at least one opening defined therein and configured to allow visible spectrum radiation to reach said visible imaging circuitry through said membrane.

2. The wafer-level packaged focal plane array assembly of claim 1, where said ROIC of each of said respective detector elements further comprises infrared detector read out circuitry coupled to said infrared detector structure.

3. The wafer-level packaged focal plane array assembly of claim 1, wherein each of said detector elements comprises a microbolometer structure; and wherein said at least one opening of each of said respective detector elements comprises a plurality of openings configured as a grid of openings defined in said membrane of said respective detector element.

4. The wafer-level packaged focal plane array assembly of claim 3, wherein said infrared detector structure of each of said respective detector elements comprises a diffractive resonant cavity (DRC) microbolometer structure and further comprises a lead metal reflector disposed between said substrate and said membrane of each of said respective detector elements and having an upper surface configured to reflect infrared radiation; wherein said at least one opening of each of said respective detector elements comprises a plurality of openings configured as a grid of openings defined in said membrane of said respective detector element; and wherein said lead metal reflector of each of said respective detector elements is patterned to have openings configured to allow said visible radiation to reach said visible imaging circuitry of said respective detector element through said lead metal reflector of said respective detector element.

5. The wafer-level packaged focal plane array assembly of claim 3, wherein said ROIC of each of said respective detector elements comprises CMOS circuitry; wherein said infrared detector structure of each of said respective detector elements comprises a diffractive resonant cavity (DRC) microbolometer structure; wherein a top metal layer of said CMOS circuitry of each of said respective detector elements is configured as a lead metal reflector for said DRC microbolometer structure of said respective detector element and has an upper surface configured to reflect infrared radiation; wherein said at least one opening of each of said respective detector elements comprises a plurality of openings configured as a grid of openings defined in said membrane of said respective detector element; and wherein said lead metal reflector of each of said respective detector elements is patterned to have openings configured to allow said visible radiation to reach said visible imaging circuitry of said respective detector element through said lead metal reflector of said respective detector element.

6. The wafer-level packaged focal plane array assembly of claim 1, wherein said infrared detector structure of each of said respective detector elements comprises a diffractive resonant cavity (DRC) microbolometer structure having a time constant of less than about 5 milliseconds.

7. The wafer-level packaged focal plane array assembly of claim 1, wherein said infrared detector structure of each of said respective detector elements comprises a diffractive resonant cavity (DRC) microbolometer structure; and wherein said at least one opening of each of said respective detector elements comprises a single opening defined in said membrane of said respective detector element over said visible imaging circuitry of said respective detector element.

8. The wafer-level packaged focal plane array assembly of claim 1, wherein said visible imaging circuitry of each of said respective detector elements comprises an array of visible pixel detector elements and an array of color filter elements, said array of color filter elements being disposed between said at least one opening in said membrane of said respective detector element and said array of visible pixel detector elements; wherein each of said visible pixel detector elements of said visible pixel detector element array of each of said respective detector elements is overlain by a respective color filter element of said color filter element array that lies in a path of said visible spectrum radiation between said at least one opening of said respective detector element and said pixel element.

9. A multi-band radiation detection system comprising the wafer-level packaged focal plane array assembly of claim 1, and further comprising a periodic chopper positioned between said multi-band focal plane array and a source of visible spectrum radiation and infrared spectrum radiation.

10. The multi-band radiation detection, system of claim 9, wherein said periodic chopper comprises a color-correcting chopper having a first portion and a second portion, said first portion being configured to allow said visible spectrum radiation to be focused on said multi-band focal plane array and said second portion being configured to focus said infrared spectrum radiation on said multi-band focal plane array.

11. A multi-band radiation detection system comprising the wafer-level packaged focal plane array assembly of claim 1, and further comprising an aperiodic shutter positioned between a source of radiation and said focal plane array.

12. A multi-band radiation detection system comprising the wafer-level packaged focal plane array assembly of claim 1, and further comprising no periodic chopper or aperiodic shutter positioned between a source of radiation and said focal plane array.

13. The wafer-level packaged focal plane array assembly of claim 1, wherein said lid wafer is sealingly assembled to said device wafer and contains a vacuum therebetween to form a wafer-level packaged focal plane array assembly.

14. A detector element, comprising:
    a substrate;
    read out integrated circuitry (ROIC) disposed on said substrate, said ROIC including visible imaging circuitry configured to detect visible spectrum radiation;
    a substantially planar infrared detector membrane, said membrane having a pianar upper surface, said membrane having at least one opening defined therein that is configured to allow visible radiation to reach said visible imaging circuitry through said membrane; and at least one thermal isolation leg supporting said infrared detector membrane in a position that is spaced above said substrate, said thermal isolation leg having a first end positioned proximal to said membrane and a second end positioned distal to said membrane, an upper surface of said first end of said thermal isolation leg being configured to lie in the same plane as the upper surface of said second end of said thermal isolation leg;

wherein a substantial entirety of the upper surface of said at least one thermal isolation leg is substantially planar and is oriented in substantially parallel and substantially coplanar relationship with said planar upper surface of said substantially planar infrared detector membrane.

15. The detector element of claim 14, wherein said at least one opening comprises a plurality of openings configured as a grid of openings defined in said membrane.

16. The detector element of claim 14, wherein said at least one opening comprises a single opening defined in said membrane over said visible imaging circuitry.

17. The detector element of claim 14, wherein said infrared detector structure comprises a diffractive resonant cavity (DRC) microbolometer structure and further comprises a lead metal reflector disposed between said substrate and said membrane and having an upper surface configured to reflect infrared radiation; wherein said at least one opening comprises a plurality of openings configured as a grid of openings defined in said membrane; and wherein said lead metal reflector is patterned to have openings configured to allow said visible radiation to reach said visible imaging circuitry through said lead metal reflector.

18. The detector element of claim 14, wherein said detector element comprises a diffractive resonant cavity (DRC) microbolometer structure and further comprises a lead metal reflector disposed between said substrate and said membrane and having an upper surface configured to reflect infrared radiation; wherein said at least one opening comprises a single opening defined in said membrane over said visible imaging circuitry; and wherein said lead metal reflector is patterned with a single opening configured to allow said visible radiation to reach said visible imaging circuitry through said lead metal reflector.

19. The detector element of claim 14, wherein said membrane comprises no opening therein.

20. A multi-band focal plane array, comprising a plurality of detector elements of claim 14.

21. A wafer-level packaged focal plane array assembly, comprising:
a device wafer, said device wafer comprising a focal plane array assembly; and
a lid wafer, said lid wafer being at least partially transparent to infrared radiation and being assembled to said device wafer so that said lid wafer allows infrared radiation to reach said focal plane array assembly through said lid wafer;
wherein said focal plane array assembly comprises:
a substrate, and
a plurality of multi-band detector elements, each of said plurality of multi-band detector elements comprising a membrane suspended over said substrate and read out integrated circuitry (ROIC) disposed on said substrate, said ROIC including visible imaging circuitry, wherein said membrane of each of said multi-band detector elements has at least one opening defined therein and is configured to allow visible spectrum radiation to reach said visible imaging circuitry through said membrane.

22. The wafer-level packaged focal plane array assembly of claim 21, wherein each respective one of said plurality of multi-band detector elements comprises a microbolometer infrared detector structure that includes said membrane of said respective multi-band detector element; and wherein said at least one opening comprises a plurality of openings configured as a grid of openings defined in said membrane of said respective multi-band detector element.

23. The wafer-level packaged focal plane array assembly of claim 22, wherein said microbolometer infrared detector structure of each of said respective multi-band detector elements comprises a diffractive resonant cavity (DRC) microbolometer structure having a time constant of less than about 5 milliseconds.

24. The wafer-level packaged focal plane array assembly of claim 21, wherein each respective one of said plurality of multi-band detector elements comprises a diffractive resonant cavity (DRC) microbolometer structure and further comprises a lead metal reflector disposed between said substrate and said membrane of said respective multi-band detector element and having an upper surface configured to reflect infrared radiation; wherein said at least one opening of each of said respective multi-band detector elements comprises a plurality of openings configured as a grid of openings defined in said membrane of said respective multi-band detector element; and wherein said. lead metal reflector of each of said respective multi-band detector elements is patterned to have openings configured to allow said visible radiation to reach said visible imaging circuitry of said respective multi-band detector element through said lead metal reflector of said respective multi-band detector element.

25. The wafer-level packaged focal plane array assembly of claim 21, wherein each respective one of said plurality of multi-band detector elements comprises a diffractive resonant cavity (DRC) microbolometer structure; wherein said ROIC of each respective one of said plurality of multi-band detector elements comprises CMOS circuitry; wherein a top metal layer of said CMOS circuitry of each of said respective multi-band detector elements is configured as a lead metal reflector for said DRC microbolometer structure of said respective multi-band detector element and has an upper surface configured to reflect infrared radiation; wherein said at least one opening of each of said respective multi-band detector elements comprises a plurality of openings configured as a grid of openings defined in said membrane of said respective multi-band detector element; and wherein said lead metal reflector of each of said respective multi-band detector elements is patterned to have openings configured to allow said visible radiation to reach said visible imaging circuitry of said respective multi-band detector element through said lead metal reflector of said respective multi-band detector element.

26. The wafer-level packaged focal plane array assembly of claim 21, wherein each respective one of said plurality of multi-band detector elements comprises a diffractive resonant cavity (DRC) microbolometer structure; and wherein said at least one opening of each of said respective multi-band detector elements comprises a single opening defined in said membrane of said respective multi-band detector element over said visible imaging circuitry of said respective multi-band detector element.

27. The wafer-level packaged focal plane array assembly of claim 21, wherein said visible imaging circuitry of each respective one of said plurality of multi-band detector elements comprises an array of visible pixel detector elements and an array of color filter elements, said array of color filter elements being disposed between said at least one opening in said membrane of said respective multi-band detector element and said array of visible pixel detector elements of said respective multi-band detector element; wherein each of said visible pixel detector elements of said visible pixel detector element array of each of said respective multi-band detector elements is overlain by a respective color filter element of said color filter element array that lies in a path of said visible spectrum radiation between said at least one opening of said respective multi-band detector element and said respective visible pixel element of said respective multi-band detector element.

28. A multi-band radiation detection system comprising the wafer-level packaged focal plane array assembly of claim 21, and further comprising a periodic chopper positioned between said focal plane array assembly and a source of visible spectrum radiation and infrared spectrum radiation.

29. The multi-band radiation detection system of claim 28, wherein said periodic chopper comprises a color-correcting chopper having a first portion and a second portion, said first portion being configured to allow said visible spectrum radiation to be focused on said focal plane array assembly and said second portion being configured to focus said infrared spectrum radiation on said focal plane array assembly.

30. A multi-band radiation detection system comprising the wafer-level packaged focal plane array assembly of claim 21, and further comprising an aperiodic shutter positioned between a source of radiation and said focal plane array assembly.

31. A multi-band radiation detection system comprising the wafer-level packaged focal plane array assembly of claim 21, and further comprising no periodic chopper or aperiodic shutter positioned between a source of radiation and said focal plane array assembly.

32. The wafer-level packaged focal plane array assembly of claim 21, wherein said lid wafer is sealingly assembled to said device wafer and contains a vacuum therebetween to form a wafer-level packaged focal plane array assembly.

33. A method of making a wafer-level packaged focal plane array assembly, comprising:
  providing a device wafer, said device wafer comprising a substrate;
  providing a focal plane array assembly of multi-band detector elements on said device wafer by:
    forming read out integrated circuitry (ROIC) on said first side of said substrate for said multi-band detector elements of said focal plane array assembly, said ROIC including visible imaging circuitry,
    forming a plurality of membrane structures on said substrate so that each of said membrane structures corresponds to a respective multi-band detector element and is suspended over said substrate with said ROIC disposed on said substrate, and
    forming at least one opening in each of said plurality of membrane structures corresponding to a respective multi-band detector element, said opening being configured to allow visible spectrum radiation to reach said visible imaging circuitry of said respective multi-band detector element through said membrane of said respective multi-band detector element;
  providing a lid wafer, said lid wafer being at least partially transparent to infrared radiation; and
  assembling said lid wafer to said device wafer to form said wafer-level packaged focal plane array assembly, and so that said lid wafer allows infrared radiation to reach said focal plane array assembly through said lid wafer.

34. The method of claim 33, wherein each respective one of said plurality of multi-band detector elements comprises a microbolometer infrared detector structure that includes said membrane of said respective multi-band detector element; and wherein said method comprises forming a plurality of openings configured as a grid in said membrane of each of said respective multi-band detector elements.

35. The method of claim 33, wherein each respective one of said plurality of multi-band detector elements comprises a diffractive resonant cavity (DRC) microbolometer structure and wherein said method further comprises:
  providing a lead metal reflector between said substrate and said membrane of each of said respective multi-band detector elements, said lead metal reflector having an upper surface configured to reflect infrared radiation;
  forming a plurality of openings configured as a grid in said membrane of each of said respective multi-band detector elements; and
  forming a plurality of openings in said lead metal reflector of each of said respective multi-band detector elements, said plurality of openings in said lead metal reflector of said respective multi-band detector element being configured to allow said visible radiation to reach said visible imaging circuitry of said respective multi-band detector element through said lead metal reflector of said respective multi-band detector element.

36. The method of claim 33, wherein each respective one of said plurality of multi-band detector elements comprises a diffractive resonant cavity (DRC) microbolometer structure; wherein said ROIC of each respective one of said plurality of multi-band detector elements comprises CMOS circuitry; and wherein said method further comprises:
  forming a top metal layer of said CMOS circuitry as a lead metal reflector for said DRC microbolometer of each of said respective multi-band detector elements that is reflective of infrared radiation;
  forming a plurality of openings configured as a grid in said membrane of each of said respective multi-band detector elements; and
  forming a plurality of openings in said lead metal reflector of each of said respective multi-band detector elements, said plurality of openings in said lead metal reflector being configured to allow said visible radiation to reach said visible imaging circuitry of said respective multi-band detector element through said lead metal reflector of said respective multi-band detector element.

37. The method of claim 33, wherein each respective one of said plurality of multi-band detector elements comprises a diffractive resonant cavity (DRC) microbolometer structure; and wherein said method comprises forming said at least one opening as a single opening in said membrane of each of said respective multi-band detector elements over said visible imaging circuitry of said respective multi-band detector element.

38. The method of claim 33, further comprising:
  forming an array of visible pixel detector elements; and
  forming an array of color filter elements between said at least one opening in said membrane of each of said respective multi-band detector elements and said array of visible pixel detector elements so that each of said visible pixel detector elements of said visible pixel element array is overlain by a respective color filter element of said color filter element array that lies in a path of said visible spectrum radiation between said at least one opening of said respective multi-band detector element and said respective visible pixel detector element.

39. The method of claim 33, further comprising assembling and sealing said lid wafer to said device wafer in the presence of a vacuum so that a vacuum is sealingly contained between said lid wafer and said device wafer to form a wafer-level vacuum packaged focal plane array assembly.

40. A multi-band detector element, comprising:
a substrate;
a first radiation detector structure disposed on said substrate, said first radiation detector structure configured to detect a radiation having a first wavelength;
a second radiation detector structure configured to absorb radiation having a second wavelength; and
a third radiation detector structure configured to absorb radiation having a third wavelength.

41. The detector element of claim 40, wherein said second radiation detector structure is supported at a position spaced above said substrate and positioned over said first radiation detector structure, said second radiation detector structure being configured to allow radiation of said first wavelength to reach said first radiation structure.

42. The detector element of claim 40, wherein said radiation having a first wavelength comprises visible radiation; and wherein said second radiation comprises infrared radiation.

43. The detector element of claim 40, where said first radiation detector structure comprises circuitry on said substrate configured to detect visible and near infrared radiation; and wherein said second radiation detector structure comprises a bolometer structure configured to detect infrared radiation.

44. A multi-band radiation detection system, comprising:
a multi-band focal plane array comprising a plurality of multi-band detector elements, each of said multi-band detector elements comprising:
a substrate,
read out integrated circuitry (ROIC) disposed on said substrate, said ROIC including visible imaging circuitry configured to detect visible radiation, and
an infrared radiation detector structure configured to absorb infrared radiation, said infrared detector structure comprising a membrane supported at a position spaced above said substrate, said membrane having at least one opening defined therein and configured to allow visible spectrum radiation to reach said visible imaging circuitry through said membrane; and
a periodic chopper positioned between said focal plane array and a source of visible spectrum radiation and infrared spectrum radiation;
wherein said periodic chopper comprises a color-correcting chopper having a first portion and a second portion, said first portion being configured to allow said visible spectrum radiation to be focused on said focal plane array and said second portion being configured to focus said infrared spectrum radiation on said focal plane array.

45. A multi-band radiation detection system, comprising:
a focal plane array assembly, said focal plane array assembly comprising:
a substrate, and
a plurality of multi-band detector elements, each of said plurality of multi-band detector elements comprising a membrane suspended over said substrate and read out integrated circuitry (ROIC) disposed on said substrate, said ROIC including visible imaging circuitry.

* * * * *

UNITED STATES PATENT AND TRADEMARK OFFICE
CERTIFICATE OF CORRECTION

PATENT NO. : 7,459,686 B2
APPLICATION NO. : 11/606880
DATED : December 2, 2008
INVENTOR(S) : Syllaios et al.

It is certified that error appears in the above-identified patent and that said Letters Patent is hereby corrected as shown below:

In claim 14, column 26, line 64, delete "pianar," and insert --planar--.

In claim 45, column 32, line 31, insert --wherein said membrane of each of said multi-band detector elements has at least one opening defined therein and is configured to allow visible spectrum radiation to reach said visible imaging circuitry through said membrane; and a periodic chopper positioned between said focal plane array assembly and a source of visible spectrum radiation and infrared spectrum radiation;

wherein said periodic chopper comprises a color-correcting chopper having a first portion and a second portion, said first portion being configured to allow said visible spectrum radiation to be focused on said focal plane array assembly and said second portion being configured to focus said infrared spectrum radiation on said focal plane array assembly.--

Signed and Sealed this

Third Day of February, 2009

JOHN DOLL
*Acting Director of the United States Patent and Trademark Office*